United States Patent
Hashimoto et al.

(10) Patent No.: US 11,774,854 B2
(45) Date of Patent: Oct. 3, 2023

(54) SUBSTRATE PROCESSING METHOD, STORAGE MEDIUM, AND SUBSTRATE PROCESSING APPARATUS

(71) Applicant: Tokyo Electron Limited, Tokyo (JP)

(72) Inventors: Yusaku Hashimoto, Koshi (JP); Kouichirou Tanaka, Koshi (JP); Masahiro Fukuda, Koshi (JP); Atsushi Ookouchi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/959,517

(22) Filed: Oct. 4, 2022

(65) Prior Publication Data
US 2023/0026275 A1  Jan. 26, 2023

Related U.S. Application Data

(63) Continuation of application No. 17/385,387, filed on Jul. 26, 2021, now Pat. No. 11,480,881.

(30) Foreign Application Priority Data

Jul. 28, 2020 (JP) .................................. 2020-127488

(51) Int. Cl.
G03F 7/16 (2006.01)
(52) U.S. Cl.
CPC .................................... G03F 7/16 (2013.01)

(58) Field of Classification Search
CPC . G03F 7/16; G03F 7/3021; G03F 7/30; H01L 21/67051; H01L 21/6715; H01L 21/67178; H01L 21/0273; H01L 21/02057
See application file for complete search history.

(56) References Cited

U.S. PATENT DOCUMENTS

| | | | |
|---|---|---|---|
| 9,256,131 B2* | 2/2016 | Takeguchi | G03F 7/3021 |
| 9,649,577 B2 | 5/2017 | Iseki et al. | |
| 9,653,367 B2* | 5/2017 | Maehr | C23C 16/042 |
| 9,793,118 B2* | 10/2017 | Ahn | B05B 13/0242 |
| 10,991,603 B2* | 4/2021 | Kwon | H01L 21/67028 |
| 2020/0050111 A1 | 2/2020 | Hashimoto et al. | |

FOREIGN PATENT DOCUMENTS

JP  2016-111345 A  6/2016

* cited by examiner

*Primary Examiner* — Hung V Nguyen
(74) *Attorney, Agent, or Firm* — Nath, Goldberg & Meyer; Jerald L. Meyer; Tanya E. Harkins

(57) ABSTRACT

A method of processing a substrate includes: performing a first developing process of moving a nozzle having one end surface and a discharge port opened at the end surface while making the end surface come into contact with a developer on a front surface of a substrate in a state in which the nozzle is disposed so that the end surface faces the front surface and the developer is discharged from the discharge port at a first flow rate while rotating the substrate; and after the first developing process, performing a second developing process of discharging the developer from the discharge port at a second flow rate higher than the first flow rate in a state in which the end surface is in contact with the developer on the front surface at a position facing a center of the front surface of the substrate while rotating the substrate.

7 Claims, 17 Drawing Sheets

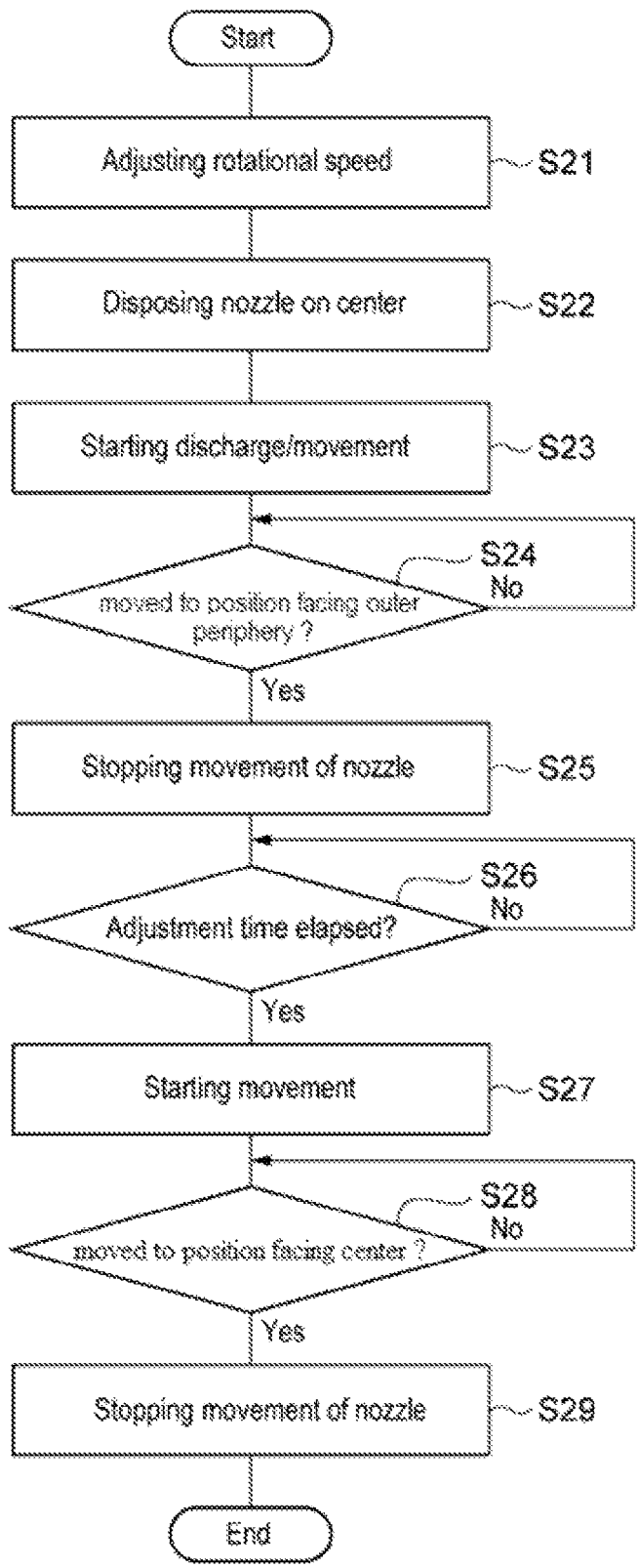

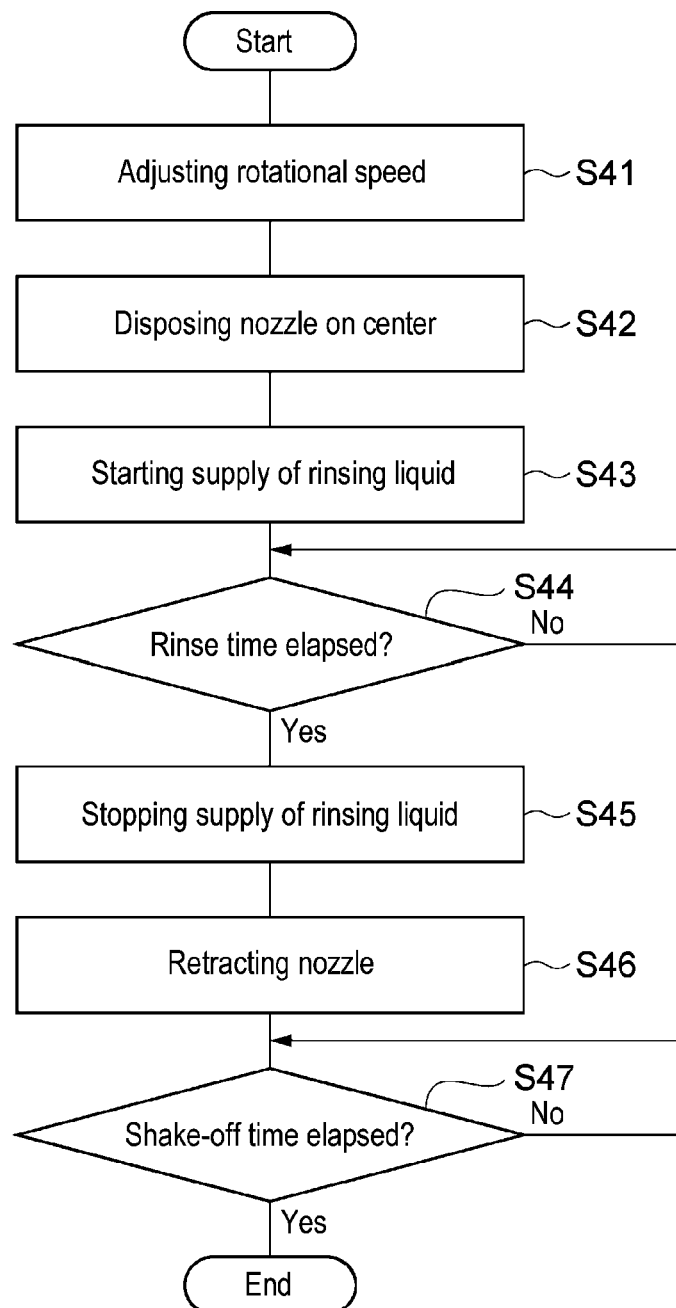

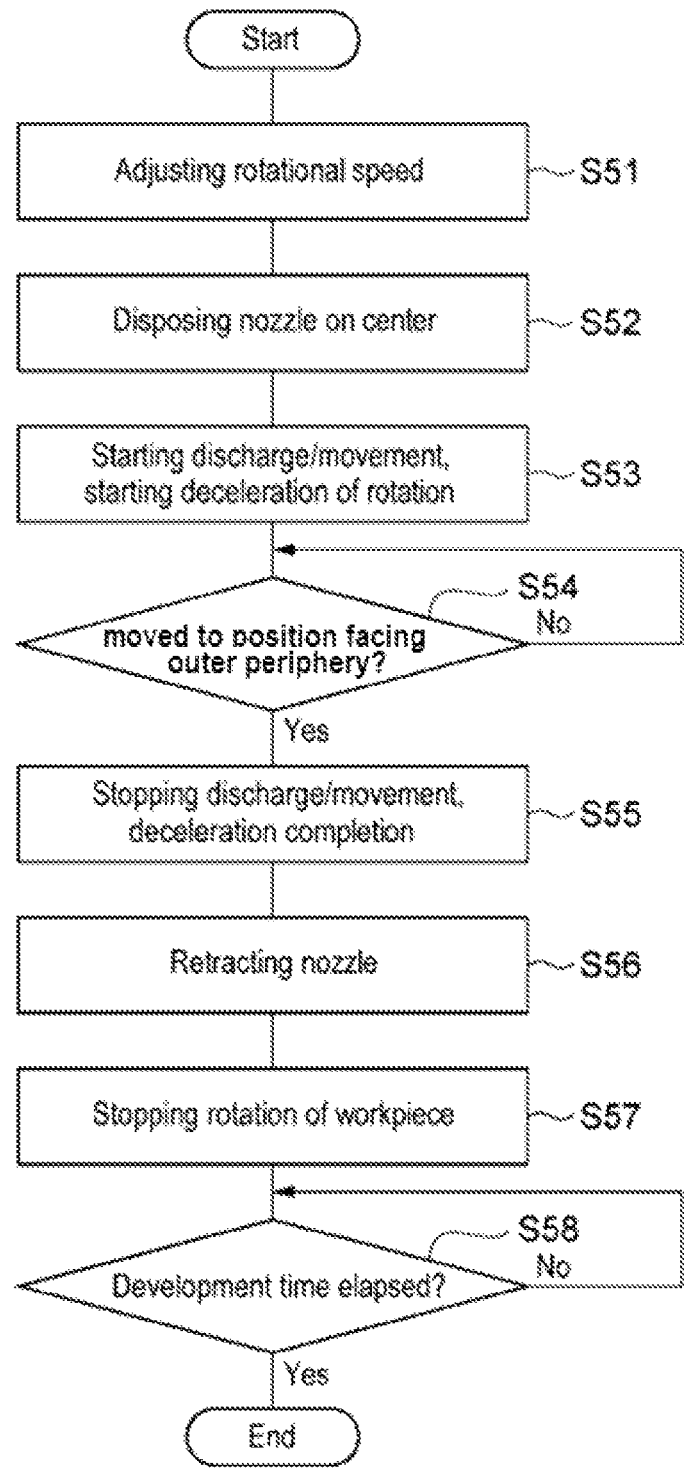

SUBSTRATE PROCESSING METHOD, STORAGE MEDIUM, AND SUBSTRATE PROCESSING APPARATUS

CROSS-REFERENCE TO RELATED APPLICATION

This is a Continuation Application of U.S. patent application Ser. No. 17/385,387, filed Jul. 26, 2021, an application claiming the benefit from Japanese Application No. 2020-127488, filed Jul. 28, 2020, the entire contents of each of which are hereby incorporated by reference in their entirety.

TECHNICAL FIELD

The present disclosure relates to a substrate processing method, a non-transitory computer-readable storage medium, and a substrate processing apparatus.

BACKGROUND

Patent Document 1 discloses a substrate processing method including a liquid collection forming step of forming a liquid collection of a dilution developer, which is diluted with pure water, in the central portion of a substrate, a liquid film forming step of forming a liquid film of the dilution developer by rotating the substrate at a first rotational speed so that the liquid collection of the dilution developer diffuses over the entire surface of the substrate, and a developer supplying step of supplying a developer onto the substrate by moving a nozzle having a liquid contact surface in a radial direction passing through the center of the substrate, while forming a liquid collection of the developer between the substrate and the liquid contact surface by supplying the developer from the nozzle, in a state in which the substrate is rotated at a second rotational speed lower than the first rotational speed.

PRIOR ART DOCUMENTS

Patent Document

Patent Document 1: Japanese laid-open publication No. 2016-111345

SUMMARY

According to one embodiment of the present disclosure, there is provided a method of processing a substrate includes: performing a first developing process of moving a nozzle having one end surface and a discharge port opened at the end surface while making the end surface come into contact with a developer on a front surface of a substrate in a state in which the nozzle is disposed so that the end surface faces the front surface of the substrate and the developer is discharged from the discharge port at a first flow rate while rotating the substrate; and after the first developing process, performing a second developing process of discharging the developer from the discharge port at a second flow rate higher than the first flow rate in a state in which the end surface is in contact with the developer on the front surface of the substrate at a position facing a center of the front surface of the substrate while rotating the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 10 is a flow chart showing an example of a series of processes including a first developing process.

FIG. 14 is a flow chart showing an example of a series of processes including a first rinsing process.

FIG. 16 is a flow chart showing an example of a series of processes including a third developing process.

DETAILED DESCRIPTION

Figure 1:
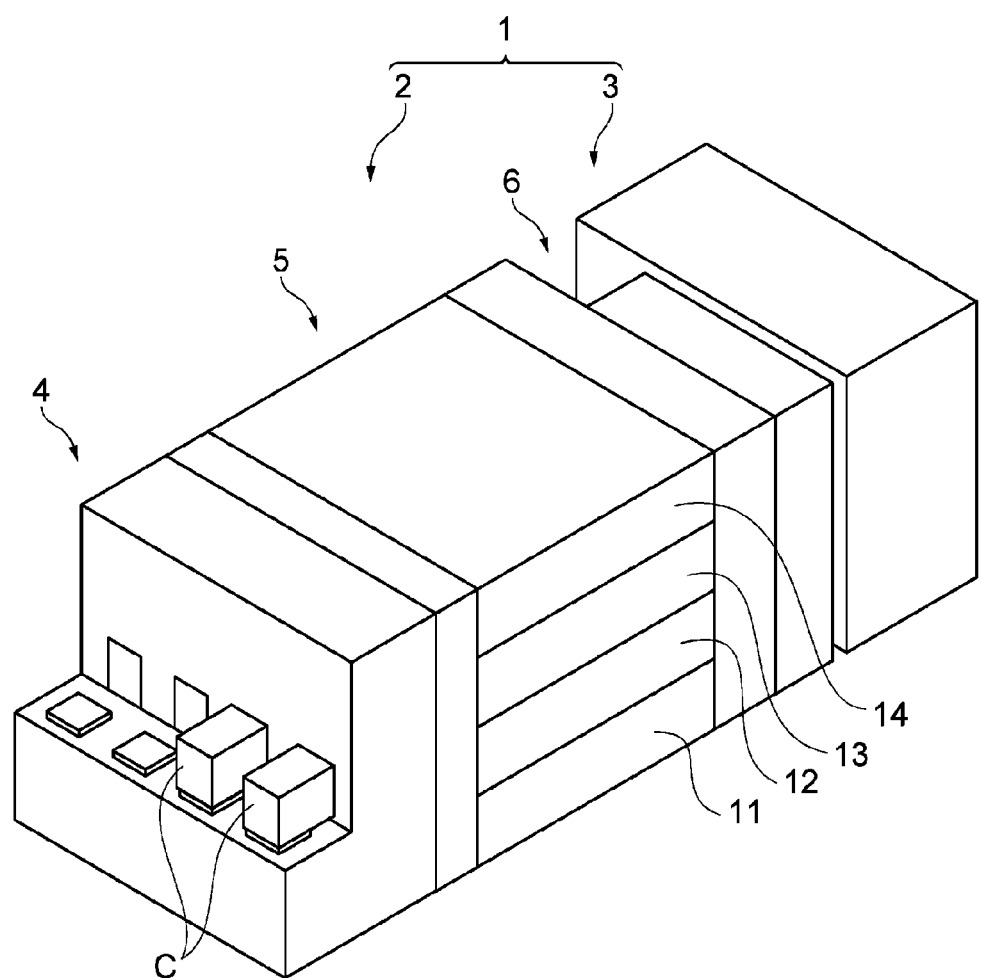
FIG. 1 is a perspective view schematically showing an example of a substrate processing system.

Hereinafter, one embodiment will be described with reference to the drawings. In the description, the same elements or elements having the same function are denoted by the same reference numerals, and explanation thereof will not be repeated. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Substrate Processing System]

A substrate processing system 1 shown in FIG. 1 is a system that forms, exposes, and develops a photosensitive film on a workpiece W. The workpiece W to be processed is, for example, a substrate, or a substrate in which a film, a circuit, or the like is formed by performing a predetermined process. The substrate included in the workpiece W is, for example, a wafer containing silicon. The workpiece W (substrate) may be formed in a circular shape. The workpiece W to be processed may be a glass substrate, a mask substrate, a FPD (Flat Panel Display), or the like, or may be an intermediate body obtained by subjecting these substrates or the like to a predetermined process. The photosensitive film is, for example, a resist film.

The substrate processing system 1 includes a coating/developing apparatus 2 and an exposing apparatus 3. The exposing apparatus 3 is an apparatus that exposes a resist film (photosensitive film) formed on the workpiece W (substrate). Specifically, the exposing apparatus 3 irradiates an exposure-target portion of the resist film with an energy ray by a method such as immersion exposure. The coating/developing apparatus 2 performs a process of forming the resist film by coating a resist (chemical solution) onto the surface of the workpiece W before the exposing process by the exposing apparatus 3, and performs a developing process for the resist film after the exposing process.

Figure 2:
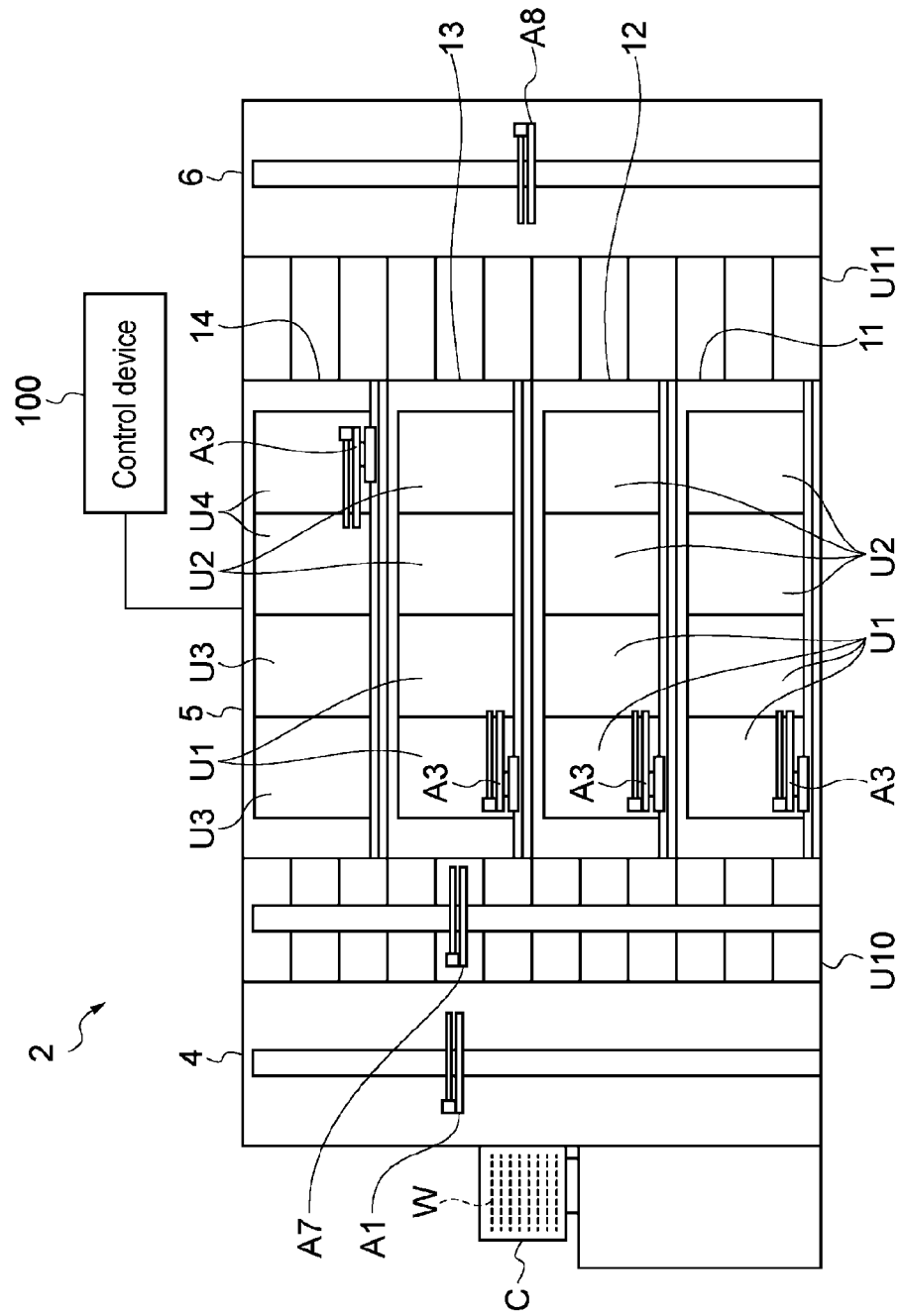
FIG. 2 is a side view schematically showing an example of a coating/developing apparatus.

Hereinafter, the configuration of the coating/developing apparatus 2, which is an example of a substrate processing apparatus, will be described. As shown in FIGS. 1 and 2, the coating/developing apparatus 2 includes a carrier block 4, a processing block 5, an interface block 6, and a control device 100 (controller).

The carrier block 4 loads the workpiece W into the coating/developing apparatus 2 and unloads the workpiece W from the coating/developing apparatus 2. For example, the carrier block 4 can support a plurality of carriers C for the workpiece W and includes a transfer device A1 equipped with a transfer arm. Each of the carriers C accommodates, for example, a plurality of circular workpieces W. The transfer device A1 takes out the workpiece W from the carrier C, passes the same to the processing block 5, receives the workpiece W from the processing block 5, and returns the same to the carrier C. The processing block 5 has processing modules 11, 12, 13, and 14.

The processing module 11 incorporates a coating unit U1, a heat treatment unit U2, and a transfer device A3 for transferring the workpiece W to these units. The processing module 11 forms a lower layer film on the surface of the workpiece W by the coating unit U1 and the heat treatment unit U2. The coating unit U1 coats a processing liquid for formation of the lower layer film on the workpiece W. The heat treatment unit U2 performs various heat treatments related to the formation of the lower layer film.

The processing module 12 incorporates a coating unit U1, a heat treatment unit U2, and a transfer device A3 for transferring the workpiece W to these units. The processing module 12 forms a resist film on a lower layer film by the coating unit U1 and the heat treatment unit U2. The coating unit U1 coats a processing liquid for formation of the resist film on the lower layer film. The processing liquid for formation of the resist film may be a resist liquid having a medium viscosity or higher. The viscosity of the processing liquid for formation of the resist film may be in a range of 50 cP to 1,000 cP, a range of 100 cP to 800 cP, or a range of 200 cP to 600 cP. The heat treatment unit U2 performs various heat treatments related to the formation of the resist film. The thickness of the resist film may be in a range of 5 µm to 30 µm, a range of 6 µm to 25 µm, or a range of 7 µm to 20 µm.

The processing module 13 incorporates a coating unit U1, a heat treatment unit U2, and a transfer device A3 for transferring the workpiece W to these units. The processing module 13 forms an upper layer film on the resist film by the coating unit U1 and the heat treatment unit U2. The coating unit U1 coats a processing liquid for formation of the upper layer film on the resist film. The heat treatment unit U2 performs various heat treatments related to the formation of the upper layer film.

The processing module 14 incorporates a developing unit U3, a heat treatment unit U4, and a transfer device A3 for transferring the workpiece W to these units. The processing module 14 performs development of the resist film subjected to the exposing process and heat treatment related to the development by the developing unit U3 and the heat treatment unit U4. The developing unit U3 forms a resist pattern (develops the resist film) by coating a developer on the surface of the exposed workpiece W and then rinsing the developer with a rinsing liquid. The heat treatment unit U4 performs various heat treatments related to the development. Specific examples of the heat treatment may include heat treatment before development (PEB: Post Exposure Bake), heat treatment after development (PB: Post Bake), and the like.

A shelf unit U10 is provided close to the carrier block 4 inside the processing block 5. The shelf unit U10 is partitioned into a plurality of cells arranged in a vertical direction. A transfer device A7 including an elevating arm is provided in the vicinity of the shelf unit U10. The transfer device A7 raises and lowers the workpiece W between the cells of the shelf unit U10.

A shelf unit U11 is provided close to the interface block 6 inside the processing block 5. The shelf unit U11 is partitioned into a plurality of cells arranged in the vertical direction.

The interface block 6 transfers the workpiece W to and from the exposing apparatus 3. For example, the interface block 6 incorporates a transfer device A8 including a transfer arm and is connected to the exposing apparatus 3. The transfer device A8 delivers the workpiece W disposed on the shelf unit U11 to the exposing apparatus 3. The transfer device A8 receives the workpiece W from the exposing apparatus 3 and transfer the same to the shelf unit U11.

The control device 100 controls the coating/developing apparatus 2 so as to execute a coating/developing process in the following procedure, for example. First, the control device 100 controls the transfer device A1 so as to transfer the workpiece W in the carrier C to the shelf unit U10 and controls the transfer device A7 so as to dispose the workpiece W in a cell for the processing module 11.

Subsequently, the control device 100 controls the transfer device A3 so as to transfer the workpiece W on the shelf unit U10 to the coating unit U1 and the heat treatment unit U2 in the processing module 11. Further, the control device 100 controls the coating unit U1 and the heat treatment unit U2 so as to form a lower layer film on the surface of the workpiece W. After that, the control device 100 controls the transfer device A3 so as to return the workpiece W on which the lower layer film is formed to the shelf unit U10, and controls the transfer device A7 so as to dispose the workpiece W in a cell for the processing module 12.

Subsequently, the control device 100 controls the transfer device A3 so as to transfer the workpiece W on the shelf unit U10 to the coating unit U1 and the heat treatment unit U2 in the processing module 12. Further, the control device 100 controls the coating unit U1 and the heat treatment unit U2 so as to form a resist film on the surface of the workpiece W. After that, the control device 100 controls the transfer device A3 so as to return the workpiece W to the shelf unit U10, and controls the transfer device A7 so as to dispose the workpiece W in a cell for the processing module 13.

Subsequently, the control device 100 controls the transfer device A3 so as to transfer the workpiece W on the shelf unit U10 to each unit in the processing module 13. Further, the control device 100 controls the coating unit U1 and the heat treatment unit U2 so as to form an upper layer film on the resist film of the workpiece W. After that, the control device 100 controls the transfer device A3 so as to transfer the workpiece W to the shelf unit U11.

Subsequently, the control device 100 controls the transfer device A8 so as to transfer the workpiece W on the shelf unit U11 to the exposing apparatus 3. After that, the control device 100 controls the transfer device A8 so as to receive the exposed workpiece W from the exposing apparatus 3 and dispose the same in a cell for the processing module 14 in the shelf unit U11.

Subsequently, the control device 100 controls the transfer device A3 so as to transfer the workpiece W on the shelf unit U11 to each unit in the processing module 14, and controls the developing unit U3 and the heat treatment unit U4 so as to develop the resist film of the workpiece W. After that, the control device 100 controls the transfer device A3 so as to return the workpiece W to the shelf unit U10, and controls the transfer device A7 and the transfer device A1 so as to return the workpiece W to the carrier C. In this way, the coating/developing process is completed.

A specific configuration of the substrate processing apparatus is not limited to the configuration of the coating/developing apparatus 2 illustrated above. The substrate processing apparatus may be any one as long as it includes a developing unit U3 and a control device 100 capable of controlling the developing unit U3.

(Developing Unit)

Figure 3:
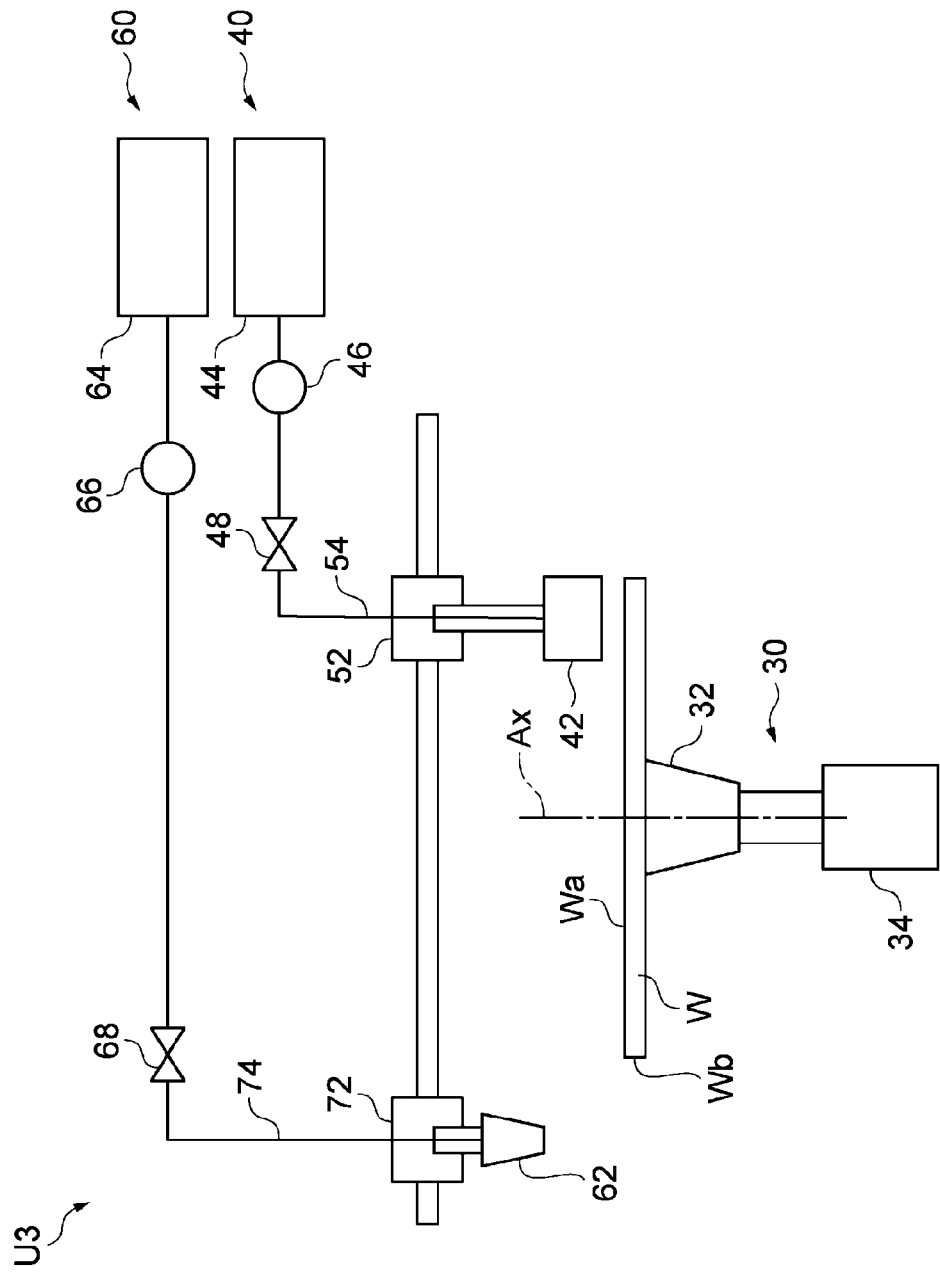
FIG. 3 is a schematic view showing an example of a developing unit.
Figure 4:
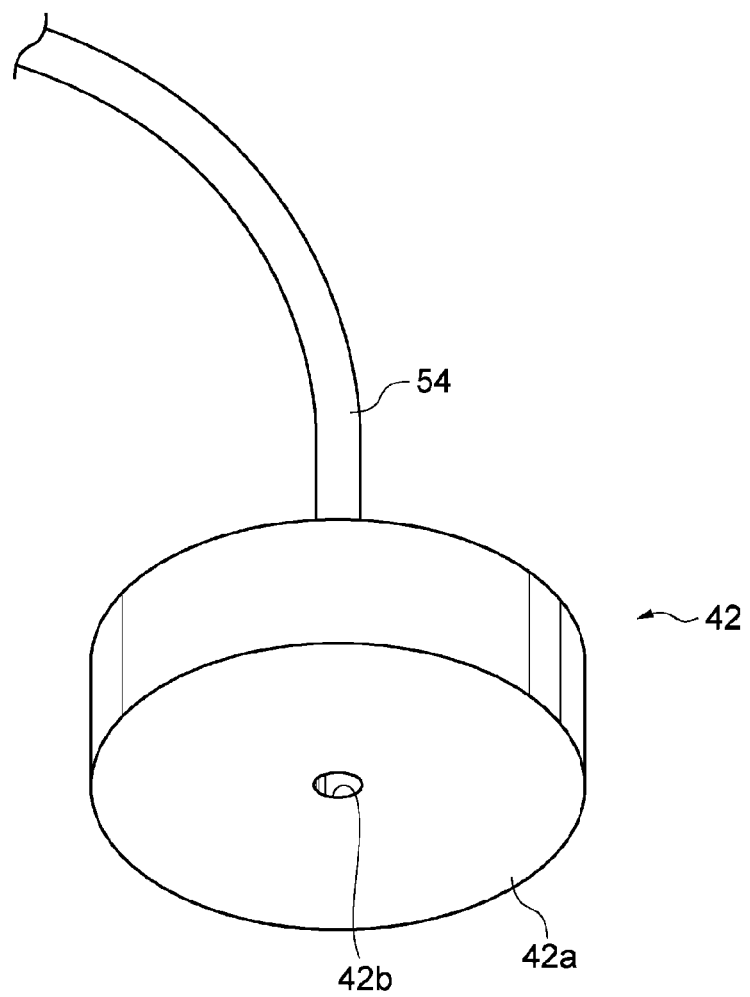
FIG. 4 is a perspective view showing an example of a nozzle for discharging a developer.

Subsequently, an example of the developing unit U3 will be described in detail with reference to FIGS. 3 and 4. As shown in FIG. 3, the developing unit U3 has, for example, a rotating/holding part 30, a developer supply part 40 (liquid supply part), and a rinsing liquid supply part 60.

The rotating/holding part 30 rotates the workpiece W while holding the workpiece W. The rotating/holding part 30 has, for example, a holder 32 and a rotation driver 34. The holder 32 supports the back surface of the workpiece W with the front surface Wa of the workpiece W oriented upward, and holds the workpiece W by, for example, vacuum suction. The rotation driver 34 rotates the holder 32 around a vertical rotational axis Ax by a power source such as an electric motor. As a result, the workpiece W rotates around the rotational axis Ax. The holder 32 may hold the workpiece W so that the center of the workpiece W substantially coincides with the rotational axis Ax.

The developer supply part 40 supplies a developer to the front surface Wa of the workpiece W held by the holder 32. The developer is a processing liquid for removing a removal-target portion of the exposed resist film. The removal-target portion of the resist film is a portion that is soluble in the developer after the exposing process. When the developer is of a positive type, an exposed portion in the exposing process is soluble in the developer. When the developer is a negative type, an unexposed portion in the exposing process is soluble in the developer. A specific example of the positive-type developer may include an alkaline solution. A specific example of the negative-type developer may include an organic solvent. The developer supply part 40 includes, for example, a nozzle 42, a tank 44, a pump 46, a valve 48, and a nozzle driver 52 (driver).

The nozzle 42 discharges the developer toward the front surface Wa of the workpiece W. As shown in FIG. 4, the nozzle 42 includes one end surface 42a and one discharge port 42b. The end surface 42a faces the front surface Wa of the workpiece W held by the holder 32. The discharge port 42b is provided on the end surface 42a (opened on the end surface 42a). The nozzle 42 may have a circular end surface 42a, and the discharge port 42b may be opened at the central portion of the end surface 42a. As an example, the center of the end surface 42a substantially coincides with the center of the discharge port 42b.

The area of the end surface 42a is smaller than that of the front surface Wa of the workpiece W. The area of the end surface 42a may be, for example, 1 to 15%, 1 to 11%, or 1 to 3% of the area of the front surface Wa of the workpiece W. The nozzle 42 can be made of a resin material such as PTFE. The nozzle 42 may include a plurality of discharge ports 42b distributed on the end surface 42a. The shape (contour) of the discharge port 42b may be circular or elliptical, polygonal, or slit shape. The area (opening area) of the discharge port 42b may be about 0.3% to 5% of the area of the end surface 42a.

Returning to FIG. 3, the nozzle 42 is connected to the tank 44 via a pipeline 54. The tank 44 stores the developer. The pump 46 and the valve 48 are provided in the pipeline 54. The pump 46 is, for example, a bellows pump, and forcibly feeds the developer from the tank 44 to the nozzle 42. The valve 48 is, for example, an air operation valve, and adjusts an opening degree of the pipeline 54. By controlling the valve 48, it is possible to switch between a state in which the developer is discharged from the nozzle 42 and a state in which the developer is not discharged from the nozzle 42. Further, by controlling at least one of the pump 46 and the valve 48, it is possible to adjust a discharge flow rate (discharge flow rate per unit time) of the developer from the nozzle 42.

The nozzle driver 52 adjusts a position of the nozzle 42. More specifically, the nozzle driver 52 moves the nozzle 42 so as to cross above the workpiece W with the end surface 42a oriented downward, and raises and lowers the nozzle 42. For example, the nozzle driver 52 has a mechanism for moving the nozzle 42 along the front surface Wa of the workpiece W by a power source such as an electric motor, and a mechanism for raising and lowering the nozzle 42 by a power source such as an electric motor. When moving the nozzle 42 along the front surface Wa of the workpiece W, the nozzle driver 52 moves the nozzle 42 along a path passing through the rotational axis Ax of the workpiece W. The nozzle driver 52 may move the nozzle 42 along a straight path, or may move the nozzle 42 along a curved path.

The rinsing liquid supply part 60 supplies a rinsing liquid, which is different from the developer, to the front surface Wa of the workpiece W held by the holder 32. The rinsing liquid is used to wash away the developer. The rinsing liquid is also used as a pre-wet liquid that is to be supplied to the front surface Wa before the developer is supplied. The rinsing liquid is, for example, pure water or DIW (Deionized Water). The rinsing liquid supply part 60 includes, for example, a nozzle 62, a tank 64, a pump 66, a valve 68, and a nozzle driver 72.

The nozzle 62 discharges the rinsing liquid toward the front surface Wa of the workpiece W. The nozzle 62 is connected to the tank 64 via a pipeline 74. The tank 64 stores the rinsing liquid. The pump 66 and the valve 68 are provided in the pipeline 74. The pump 66 is, for example, a bellows pump, and forcibly feeds the rinsing liquid from the tank 64 to the nozzle 62. The valve 68 is, for example, an air operation valve, and adjusts an opening degree in the pipeline 74. By controlling the valve 68, it is possible to switch between a state in which the rinsing liquid is discharged from the nozzle 62 and a state in which the rinsing liquid is not discharged from the nozzle 62. By controlling at least one of the pump 66 and the valve 68, it is also possible to adjust a discharge flow rate of the rinsing liquid from the nozzle 62.

The nozzle driver 72 moves the nozzle 62 by a power source such as an electric motor. Specifically, the nozzle driver 72 moves the nozzle 62 along the front surface Wa of the workpiece W with the discharge port of the nozzle 62 oriented downward.

(Control Device)

Figure 5:
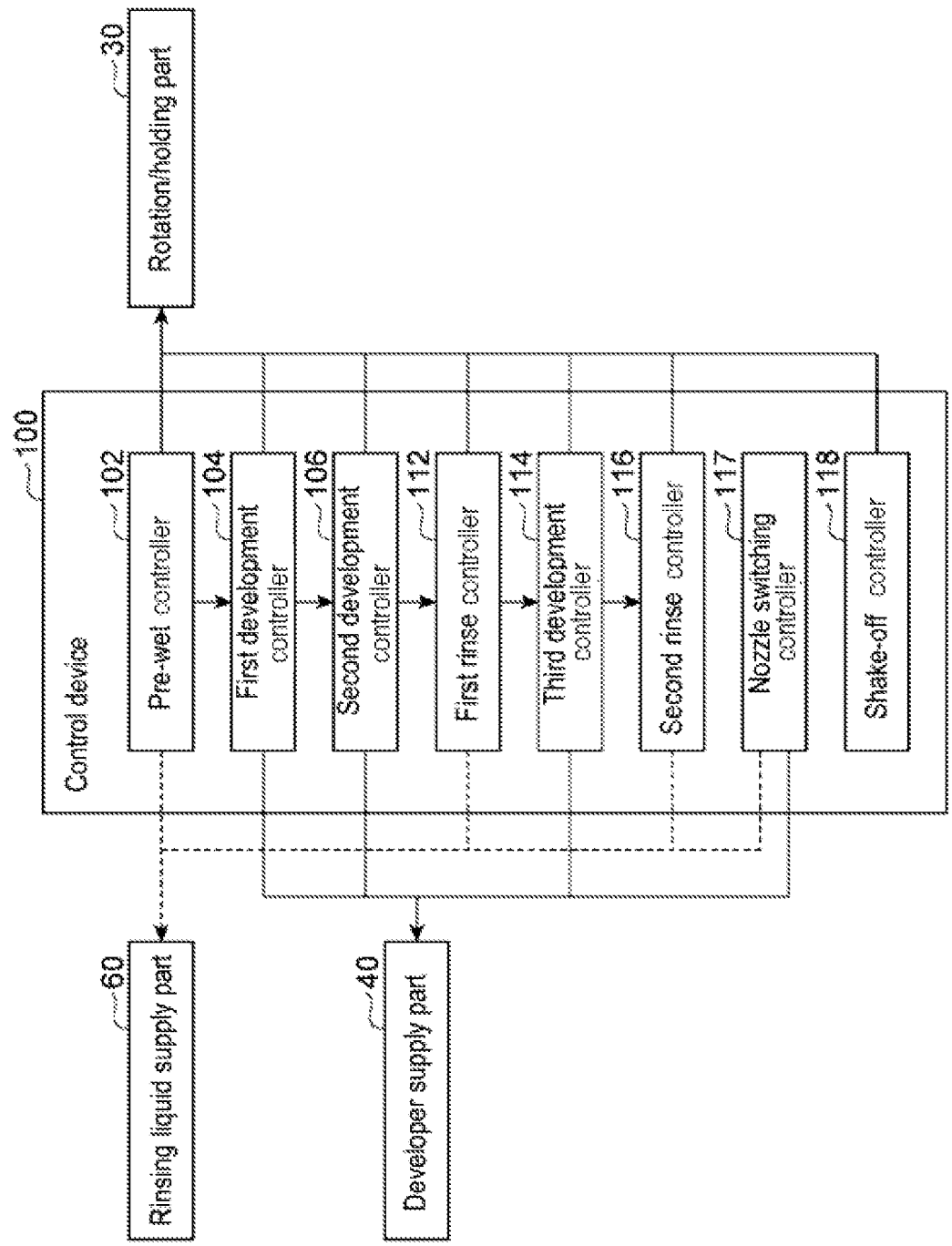
FIG. 5 is a block diagram showing an example of a functional configuration of a control device.
Figure 6:
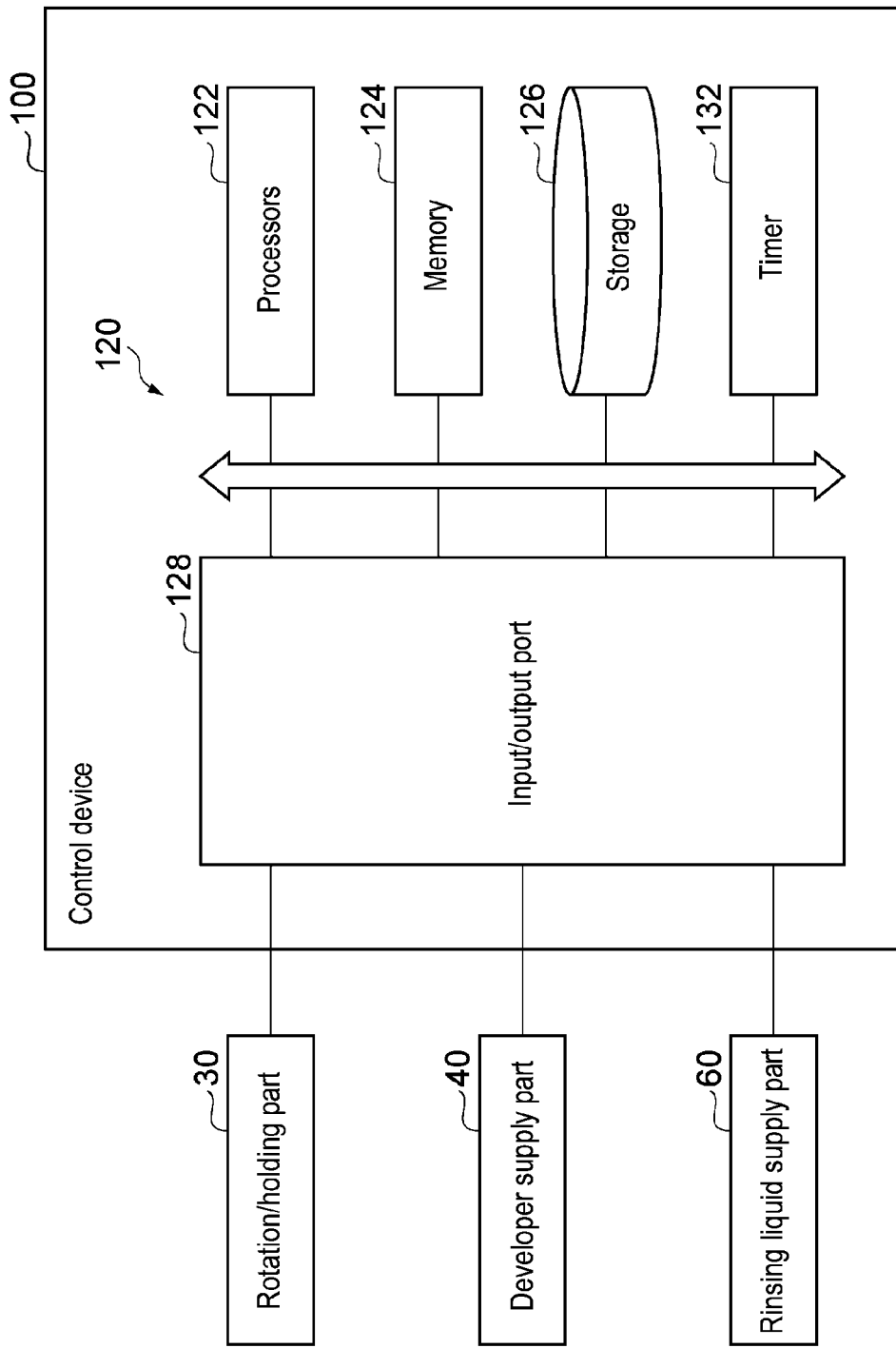
FIG. 6 is a block diagram showing an example of a hardware configuration of the control device.

Next, an example of the control device 100 will be described with reference to FIGS. 5 and 6. The control device 100 controls the coating/developing apparatus 2 including the developing unit U3. As shown in FIG. 5, the control device 100 includes, as functional configurations (hereinafter referred to as "functional modules"), for example, a pre-wet controller 102, a first development controller 104, a second development controller 106, a first rinse controller 112, a third development controller 114, a second rinse controller 116, and a nozzle switching controller 117. A process executed by each functional module corresponds to a process executed by the control device 100.

The pre-wet controller 102 causes the developing unit U3 to execute a pre-wetting process. The pre-wetting process includes rotating the holder 32 that holds the workpiece W by the rotation driver 34, and supplying the rinsing liquid to the front surface Wa of the workpiece W by the rinsing liquid supply part 60 while rotating the workpiece W by the rotating/holding part 30.

The first development controller 104 causes the developing unit U3 to execute a first developing process. The first developing process is a process of moving the nozzle 42 by the nozzle driver 52 while making the end surface 42a come into contact with the developer on the front surface Wa of the workpiece W in a state in which the nozzle 42 is disposed so that the end surface 42a faces the front surface Wa of the workpiece W and the developer is discharged from the discharge port 42b at a predetermined first flow rate while rotating the workpiece W by the rotating/holding part 30. The first flow rate is set in advance. As an example, the first flow rate may be 100 ml/min to 700 ml/min, 200 ml/min to 600 ml/min, or 300 ml/min to 500 ml/min. A rotational speed of the workpiece W in the first developing process is, for example, 300 rpm to 1,000 rpm.

In the first developing process, the end surface 42a comes into contact with the developer already discharged from the nozzle 42 and supplied on the front surface Wa during the execution of the first developing process, and the rinsing liquid supplied in the pre-wetting process. Hereinafter, a state in which the end surface 42a of the nozzle 42 is in contact with the processing liquid containing the developer on the front surface Wa of the workpiece W is referred to as a "liquid contact state." In the first developing process, the discharging of the developer at the first flow rate from the discharge port 42b of the nozzle 42 facing the front surface Wa of the workpiece W while rotating the workpiece W, and the moving of the nozzle 42 along the front surface Wa while maintaining the liquid contact state are performed in parallel.

The first development controller 104 may reciprocate the nozzle 42 by the nozzle driver 52 along the radial direction of the workpiece W while maintaining the liquid contact state in a state in which the developer is being discharged from the discharge port 42b at the first flow rate while rotating the workpiece W. For example, the first development controller 104 reciprocates the nozzle 42 by the nozzle driver 52 between a position facing the center (the rotational axis Ax) of the front surface Wa of the workpiece W and a position facing an outer periphery Wb of the workpiece W. In a state in which the nozzle 42 faces the center of the workpiece W, a position of either the end surface 42a or the discharge port 42b overlaps the center of the workpiece W when viewed from above vertically. In a state in which the nozzle 42 faces the outer periphery Wb of the workpiece W, the position of either the end surface 42a or the discharge port 42b overlaps the outer periphery Wb of the workpiece W when viewed from above vertically. In one example, the first development controller 104 reciprocates the workpiece W by the nozzle driver 52 between a position where the discharge port 42b overlaps the center of the workpiece W and a position where the discharge port 42b overlaps the outer periphery Wb of the workpiece W when viewed from above vertically.

The first development controller 104 may cause the developing unit U3 to execute a scan-out process in the first developing process and may cause the developing unit U3 to execute a scan-in process after the scan-out process. The scan-out process is a process of moving the nozzle 42 by the nozzle driver 52 from the center of the workpiece W toward the outer periphery Wb of the workpiece W while making the end surface 42a come into contact with the developer on the front surface Wa of the workpiece W in the state in which the developer is discharged from the discharge port 42b at the first flow rate while rotating the workpiece W by the rotating/holding part 30. In one example, the first development controller 104 moves the nozzle 42 by the nozzle driver 52 from the position where the discharge port 42b of the nozzle 42 faces the center of the workpiece W to the position where the discharge port 42b faces the outer periphery Wb while maintaining the liquid contact state.

The scan-in process is a process of moving the nozzle 42 by the nozzle driver 52 from the outer periphery Wb of the workpiece W toward the center of the workpiece W while making the end surface 42a come into contact with the developer on the front surface Wa of the workpiece W in the state in which the developer is discharged from the discharge port 42b at the first flow rate while rotating the workpiece W by the rotating/holding part 30. In one example, the first development controller 104 moves the nozzle 42 by the nozzle driver 52 from the position where the discharge port 42b faces the outer periphery Wb of the workpiece W to the position where the discharge port 42b of the nozzle 42 faces the center of the workpiece W while maintaining the liquid contact state. The first development controller 104 may stop the nozzle 42 by the nozzle driver 52 at the position facing the outer periphery Wb of the workpiece W for a predetermined period of time in the state in which the developer is discharged from the discharge port 42b at the first flow rate in the liquid contact state between the execution period of the scan-out process and the execution period of the scan-in process.

The second development controller 106 causes the developing unit U3 to execute a second developing process after the first developing process. The second developing process is a process of discharging the developer from the discharge port 42b at a predetermined second flow rate in a state in which the end surface 42a is brought into contact with the developer on the front surface Wa of the workpiece W at a position facing the center of the front surface Wa of the workpiece W while rotating the workpiece W by the rotating/holding part 30. The second flow rate is preset to a value larger than the first flow rate. As an example, the second flow rate may be 300 ml/min to 900 ml/min, 400 ml/min to 800 ml/min, or 500 ml/min to 700 ml/min.

The second development controller 106 may cause the developing unit U3 to continuously execute the second developing process of discharging the developer at the second flow rate for a predetermined period of time (the state in which the developer is discharged at the second flow rate by the developer liquid supply part 40 may be maintained for the predetermined period of time). The predetermined period of time for continuously executing the second developing process is, for example, 5 seconds to 20 seconds. A rotational speed of the workpiece W in the second developing process is, for example, 100 rpm to 1,000 rpm.

The second development controller 106 may cause the developing unit U3 to start the second developing process with the increase in the discharge flow rate of the developer from the nozzle 42 from the first flow rate to the second flow rate in a state in which the nozzle 42 is disposed at a position facing the center of the front surface Wa of the workpiece W by the first developing process. The second development controller 106 may start the second developing process while increasing the discharge flow rate to the second flow rate in a state in which the nozzle 42 is stopped by the nozzle driver 52 at a position where the nozzle 42 is disposed at the time of the end of the scan-in process of the first developing process. The second development controller 106 may start the second developing process with the increase in the discharge flow rate to the second flow rate while moving the nozzle 42 by the nozzle driver 52 to a position different from the position where the nozzle 42 is disposed at the time of the end of the scan-in process of the first developing process, in a region where the nozzle 42 faces the center of the front surface Wa of the workpiece W.

The first rinse controller 112 causes the developing unit U3 to execute a first rinsing process after the second developing process. The first rinsing process is a process of supplying the rinsing liquid to the front surface Wa of the workpiece W by the rinsing liquid supply part 60 while rotating the workpiece W by the rotating/holding part 30. After the execution of the first rinsing process, the first rinse controller 112 may continue the rotation of the workpiece W by the rotating/holding part 30 so as to shake off the rinsing liquid on the front surface Wa of the workpiece W in a state in which the supply of the rinsing liquid is stopped by the rinsing liquid supply part 60.

The discharge flow rate (discharge flow rate per unit time) of the rinsing liquid from the nozzle 62 (another nozzle) toward the front surface Wa in the first rinsing process is set to a predetermined third flow rate. The third flow rate is set to, for example, a value equal to or higher than the second flow rate which is the discharge flow rate of the developer in the second developing process. In one example, the third flow rate is 500 ml/min to 1,500 ml/min. A rotational speed of the workpiece W in the first rinsing process may be set to a value equal to or higher than the rotational speed of the workpiece W in the second developing process. In one example, the rotational speed of the workpiece W in the first rinsing process is 100 rpm to 1,500 rpm. In one example, an execution time of the first rinsing process is 3 seconds to 15 seconds.

The third development controller 114 causes the developing unit U3 to execute a third developing process after the second developing process (for example, after the first rinsing process). The third developing process is a process of supplying the developer from the nozzle 42 to the front surface Wa of the workpiece W so as to form a liquid collection of the developer, and controlling the rotating/holding part 30 to hold the liquid collection on the front surface Wa of the workpiece W. For example, in the third developing process, the third development controller 114 causes the developing unit U3 to execute the same process as the scan-out process of the first developing process (hereinafter referred to as a "scan-out process in the third developing process") in order to form the liquid collection of the developer on the front surface Wa of the workpiece W. In the scan-out process in the third developing process, the third development controller 114 may discharge the developer from the nozzle 42 at the first flow rate, as in the first developing process. The third development controller 114 causes the rotating/holding part 30 to execute a deceleration process of reducing the rotational speed of the workpiece W in parallel with the scan-out process in the third developing process.

In the deceleration process, the third development controller 114 controls the rotating/holding part 30 so as to decelerate the rotation of the workpiece W from a first rotational speed (for example, 200 rpm to 400 rpm) to a second rotational speed (for example, 5 rpm to 20 rpm) different from the first rotational speed. The deceleration process may include controlling the rotating/holding part 30 so as to gradually reduce the rotational speed of the workpiece W as the center (the discharge port 42*b*) of the end surface 42*a* of the nozzle 42 approaches the outer periphery Wb of the workpiece W. In this case, the gradual reduction may also include a stepwise reduction in plural steps. The third development controller 114 may control the rotating/holding part 30 so as to gradually reduce the deceleration of the rotation of the workpiece W as the center of the end surface 42*a* approaches the outer periphery Wb of the workpiece W. By executing the deceleration control in parallel with the scan-out process in the third developing process, excessive progress of development in the central portion of the workpiece W is suppressed in the course of forming the liquid collection of the developer, and collapse of the liquid collection in the outer peripheral portion of the workpiece W is suppressed.

The third development controller 114 may rotate the workpiece W at a relatively low rotational speed (for example, a rotational speed equal to or lower than the rotational speed at the time of completion of the deceleration process) by the rotating/holding part 30 or may stop the rotation of the workpiece W by the rotating/holding part 30, so that the liquid collection of the developer is held on the front surface Wa of the workpiece W. For example, after the formation of the liquid collection of the developer, in the same manner as in the first developing process, while rotating the workpiece W by the rotating/holding part 30, the third development controller 114 performs a scan-in operation (the scan-in process in the third developing process) of moving the nozzle 42 by the nozzle driver 52 from the outer periphery Wb of the workpiece W toward the center of the workpiece W while making the end surface 42*a* come into contact with the developer on the front surface Wa of the workpiece W. After that, the third development controller 114 controls the developing unit U3 so as to continue the state in which the rotation of the workpiece W is stopped, for a predetermined period of time (causes the developing unit U3 to execute a static development). In such a static development, the third development controller 114 may cause the developer supply part 40 to stop the discharge of the developer from the nozzle 42, or may cause the developer supply part 40 to continue the discharge of the developer at a predetermined flow rate set to be suitable for removing dissolution products, replacing the developer, and the like.

The second rinse controller 116 causes the developing unit U3 to execute a second rinsing process after the third developing process. The second rinse controller 116 causes the developing unit U3 to execute the second rinsing process in the same manner as the first rinsing process described above, for example. A discharge flow rate of the rinsing liquid and a rotational speed of the workpiece W in the second rinsing process may be the same as or different from those in the first rinsing process. After the execution of the second rinsing process, the second rinse controller 116 may continue the rotation of the workpiece W by the rotating/holding part 30 so as to shake off (dry) the rinsing liquid on the front surface Wa of the workpiece W in a state in which the supply of the rinsing liquid is stopped by the rinsing liquid supply part 60.

The nozzle switching controller 117 controls the nozzle driver 52 so as to perform at least one of disposing and retracting the nozzle 42 before and after each of the above-described first developing process, second developing process, and third developing process. For example, the nozzle switching controller 117 controls the nozzle driver 52 so as to raise the nozzle 42 above the front surface Wa of the workpiece W from a state in which the end surface 42a of the nozzle 42 is in contact with the developer on the front surface Wa of the workpiece W after the second developing process or after the static development in the third developing process. Then, the nozzle switching controller 117 controls the nozzle driver 52 so as to retract the raised nozzle 42 to the outside of the workpiece W. The nozzle switching controller 117 controls the nozzle driver 72 so as to perform at least one of disposing and retracting the nozzle 62 before and after each of the above-described pre-wetting process, first rinsing process, and second rinsing process.

The nozzle switching controller 117 may control the nozzle driver 52 so as to execute a plurality of retraction operations for retracting the nozzle 42 when the nozzle 42 is raised above the front surface Wa of the workpiece W. Each of the plurality of retraction operations (each retraction operation) includes raising the nozzle 42 by a predetermined level and stopping the nozzle 42 after the raising. By executing the retraction operation a plurality of times, an operation of raising the nozzle 42 stepwise (a nozzle operation including a plurality of raising steps) is performed. The nozzle switching controller 117 may control the nozzle driver 52 so as to make in the raising speeds of the nozzle 42 in the plurality of raising steps different from each other so that a liquid adhering to the end surface 42a does not remain.

A standby bath (not shown) having a function of making the nozzle 42 stand by inside and cleaning the end surface 42a with a cleaning liquid at the time of non-processing in which the nozzle 42 is not used, may be provided on the outside of a cup surrounding the holder 32 that holds the workpiece W. In this case, when the nozzle 42 is moved from the inside of the standby bath to the outside thereof in order to move the nozzle 42 above the cup at the start of the liquid processing, the nozzle switching controller 117 may control the nozzle driver 52 so as to perform the nozzle operation including the plurality of raising steps in the same manner as above. As a result, it is possible to prevent a liquid from adhering to the end surface 42a of the nozzle 42 in the standby bath.

The control device 100 is composed of one or a plurality of control computers. For example, the control device 100 has a circuit 120 shown in FIG. 6. The circuit 120 has one or more processors 122, a memory 124, a storage 126, an input/output port 128, and a timer 132. The storage 126 has a non-transitory computer-readable storage medium such as a hard disk. The storage medium stores a program for causing the control device 100 to execute a substrate processing method which will be described later. The storage medium may be a removable medium such as a nonvolatile semiconductor memory, a magnetic disk, or an optical disc.

The memory 124 temporarily stores the program loaded from the storage medium of the storage 126 and a calculation result obtained by the processor 122.

The processor 122 executes the above program in cooperation with the memory 124. The input/output port 128 inputs/outputs electric signals to/from the rotating/holding part 30, the developer supply part 40, the rinsing liquid supply part 60, and the like in accordance with commands from the processor 122. The timer 132 measures an elapsed time, for example, by counting a reference pulse having a fixed cycle. The hardware configuration of the control device 100 may be configured by a dedicated logic circuit or an ASIC (Application Specific Integrated Circuit) in which the dedicated logic circuit is integrated.

[Substrate Processing Method]

Figure 7:
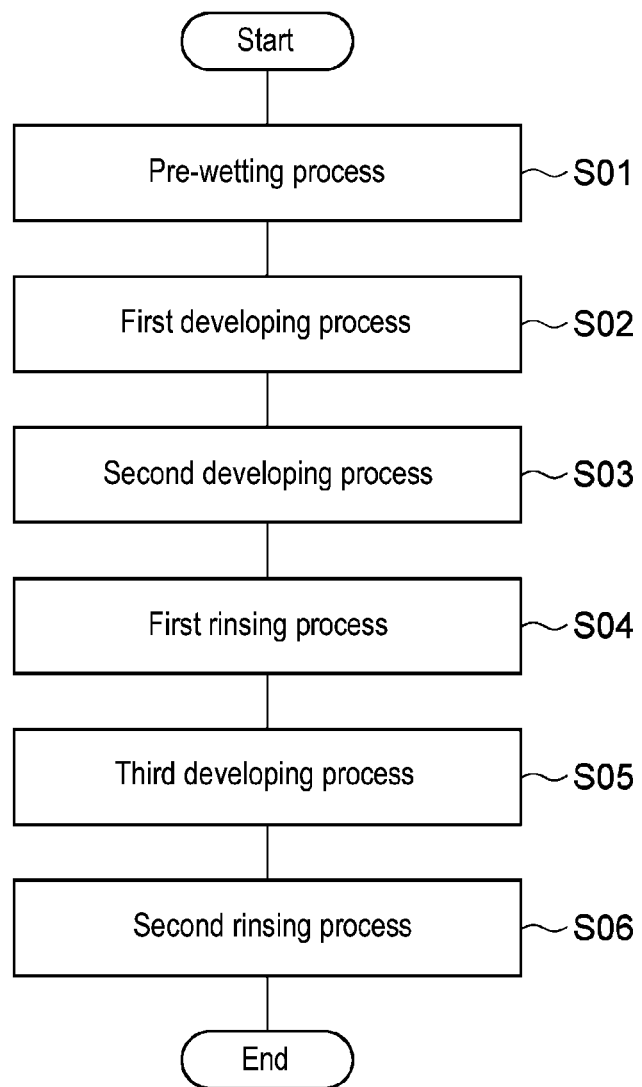
FIG. 7 is a flow chart showing an example of a pattern forming process.

Next, as an example of a substrate processing method, a pattern forming process executed in the developing unit U3 will be described with reference to FIG. 7. FIG. 7 is a flow chart showing an example of a pattern forming process for one workpiece W.

The control device 100 first executes step S01 in a state in which the workpiece W to be processed is disposed in the developing unit U3 (the rotating/holding part 30). In step S01, for example, the pre-wet controller 102 causes the developing unit U3 to execute the above-described pre-wetting process. When the workpiece W is rotated by the rotating/holding part 30, the pre-wet controller 102 supplies the rinsing liquid to the front surface Wa of the workpiece W by the rinsing liquid supply part 60. A specific example of the pre-wetting process will be described later.

Subsequently, the control device 100 executes step S02. In step S02, for example, the first development controller 104 causes the developing unit U3 to execute the above-described first developing process. When the workpiece W is rotated by the rotating/holding part 30, the first development controller 104 moves the nozzle 42 by the nozzle driver 52 while making the end surface 42a of the nozzle 42 come into contact with the developer on the front surface Wa of the workpiece W in a state in which the developer is discharged at the first flow rate from the nozzle 42 (the discharge port 42b) toward the front surface Wa of the workpiece W. A specific example of the first developing process will be described later.

Subsequently, the control device 100 executes step S03. In step S03, for example, the second development controller 106 causes the developing unit U3 to execute the above-described second developing process. When the workpiece W is rotated by the rotating/holding part 30, the second development controller 106 discharges the developer at the second flow rate from the discharge port 42b of the nozzle 42 in a state in which the end surface 42a of the nozzle 42 disposed at a position facing the center of the front surface Wa of the workpiece W is brought into contact with the developer on the front surface Wa of the workpiece W. A specific example of the second developing process will be described later.

Subsequently, the control device 100 executes step S04. In step S04, for example, the first rinse controller 112 causes the developing unit U3 to execute the first rinsing process. When the workpiece W is rotated by the rotating/holding part 30, the first rinse controller 112 may supply the rinsing liquid to the front surface Wa of the workpiece W by the rinsing liquid supply part 60. A specific example of the first rinsing process will be described later.

Subsequently, the control device 100 executes step S05. In step S05, for example, the third development controller 114 causes the developing unit U3 to execute the third developing process. The third development controller 114 supplies the developer from the nozzle 42 to the front surface Wa of the workpiece W so as to form the liquid collection of the developer, and controls the rotating/holding part 30 so as to hold the liquid collection of the developer on the front surface Wa of the workpiece W. A specific example of the third developing process will be described later.

Subsequently, the control device 100 executes step S06. In step S06, for example, the second rinse controller 116 causes the developing unit U3 to execute the second rinsing process. The second rinse controller 116 causes the developing unit U3 to execute the second rinsing process in the same manner as the first rinsing process in step S04. With the above, the pattern forming process for one workpiece W is completed. Hereinafter, each of steps S01 to S05 described above will be described, including processes before and after the respective step.

(Pre-Wetting Process)

Figure 8:
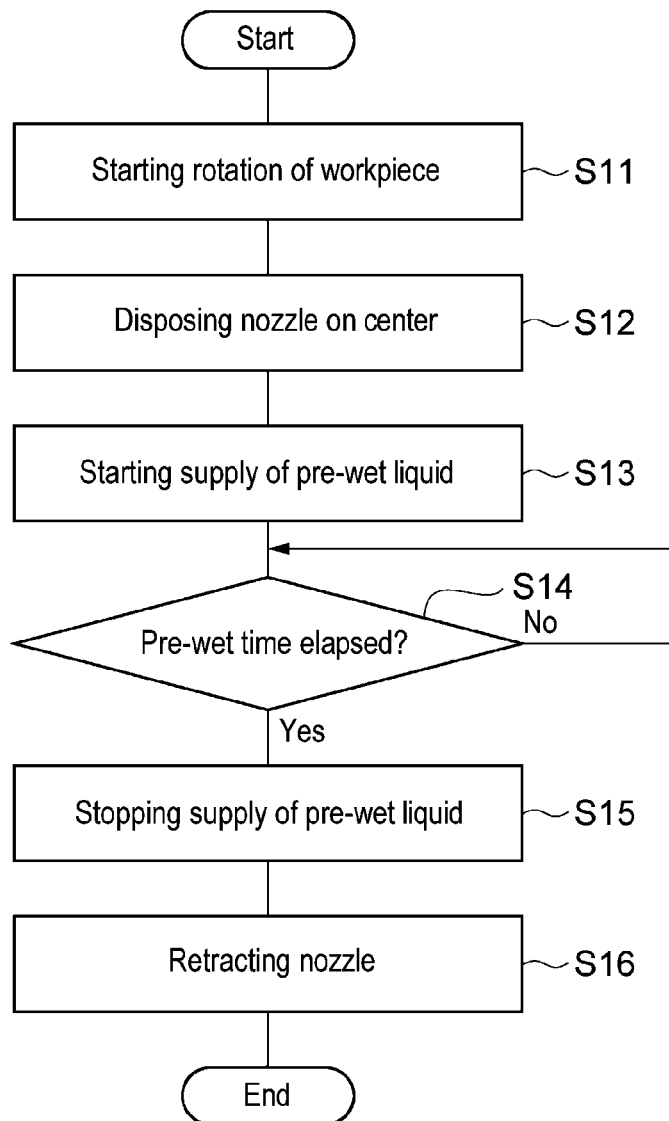
FIG. 8 is a flow chart showing an example of a series of processes including a pre-wetting process.

FIG. 8 is a flow chart showing an example of a series of processes including the pre-wetting process of step S01 and processes before and after the pre-wetting process. First, the control device 100 executes steps S11 and S12 in a state in which the rotating/holding part 30 holds the workpiece W to be processed. In step S11, for example, the control device 100 starts the rotation of the workpiece W by the rotating/holding part 30. In the subsequent steps, the rotation of the workpiece W is continued until the control device 100 stops the rotation of the workpiece W by the rotating/holding part 30. In step S12, for example, the nozzle switching controller 117 controls the nozzle driver 72 so as to dispose the nozzle 62 of the rinsing liquid supply part 60 at a position facing the center (rotational axis Ax) of the front surface Wa of the workpiece W.

Subsequently, the control device 100 executes step S13. In step S13, for example, the pre-wet controller 102 starts the supply of the rinsing liquid from the nozzle 62 to the front surface Wa of the workpiece W by the rinsing liquid supply part 60. The pre-wet controller 102 may cause the rinsing liquid supply part 60 to start the supply of the rinsing liquid by switching the valve 68 of the rinsing liquid supply part 60 from the closed state to the opened state. As a result, the pre-wetting process is started as the rinsing liquid (pre-wet liquid) begins to be discharged from the nozzle 62 onto the front surface Wa of the workpiece W being rotated by the rotating/holding part 30.

Subsequently, the control device 100 executes step S14. In step S14, for example, the pre-wet controller 102 waits from the start of the supply of the rinsing liquid in step S13 until the pre-wet time elapses. The pre-wet time is set in advance to such an extent that a desired amount of rinsing liquid is supplied onto the front surface Wa.

Figure 9:
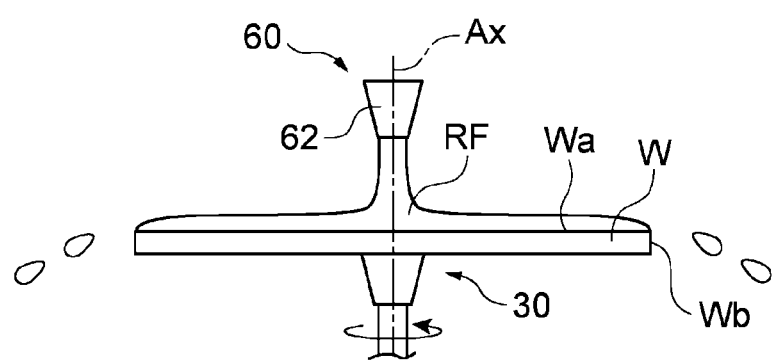
FIG. 9 is a schematic view for explaining an example of the pre-wetting process.

Subsequently, the control device 100 executes step S15. In step S15, for example, the pre-wet controller 102 stops the supply of the rinsing liquid from the nozzle 62 to the front surface Wa of the workpiece W by the rinsing liquid supply part 60. The pre-wet controller 102 may cause the rinsing liquid supply part 60 to stop the supply of the rinsing liquid by switching the valve 68 of the rinsing liquid supply part 60 from the opened state to the closed state (stop the discharge of the rinsing liquid from the nozzle 62). By executing the above steps S13 to S15 (the pre-wetting process), as shown in FIG. 9, the rinsing liquid is supplied onto the front surface Wa of the workpiece W while the workpiece W is rotated around the rotational axis Ax, a liquid film RF of the rinsing liquid is formed on the front surface Wa.

Subsequently, the control device 100 executes step S16. In step S16, for example, the nozzle switching controller 117 controls the nozzle driver 72 so as to retract the nozzle 62 from the center of the front surface Wa of the workpiece W to the outside of the workpiece W. With the above, a series of processes including the pre-wetting process is completed.

(First Developing Process)

FIG. 10 is a flow chart showing an example of a series of processes including the first developing process of step S02 and processes before and after the first developing process. The control device 100 executes steps S21 and S22 after the above-described step S16 is executed. In step S21, for example, the control device 100 controls the rotating/holding part 30 so that the rotational speed of the workpiece W is adjusted to the set value in the first developing process. In step S22, for example, the nozzle switching controller 117 controls the nozzle driver 52 so as to dispose the nozzle 42 of the developer supply part 40 at a position facing the center (rotational axis Ax) of the front surface Wa of the workpiece W. The nozzle switching controller 117 may control the nozzle driver 72 so as to dispose the nozzle 42 at a position where the discharge port 42b of the nozzle 42 faces the center of the front surface Wa of the workpiece W.

Figure 11A:
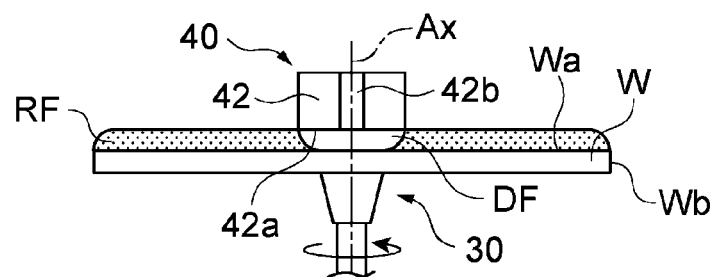
FIGS. 11A to 11D are schematic views for explaining an example of the first developing process.

Subsequently, the control device 100 executes step S23. In step S23, for example, the first development controller 104 causes the developing unit U3 to discharge the developer from the nozzle 42 and move the nozzle 42 toward the outer periphery Wb of the workpiece W. As a result, the above-described scan-out process is started. As shown in FIG. 11A, the first development controller 104 causes the developer supply part 40 to start the discharge of the developer from the discharge port 42b of the nozzle 42 facing the center of the workpiece W and causes the nozzle driver 52 to start the movement of the nozzle 42 from the center of the workpiece W toward the outer periphery Wb thereof. The first development controller 104 may controls the developer supply part 40 to start the discharge of the developer from the discharge port 42b by switching the valve 48 of the developer supply part 40 from the closed state to the opened state. The first development controller 104 controls the pump 46 or the valve 48 so that the discharge flow rate of the developer from the discharge port 42b becomes the first flow rate.

Figure 11B:
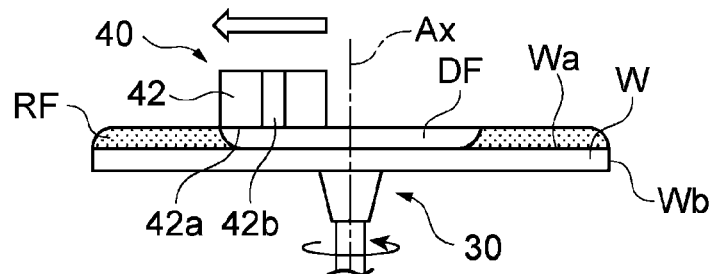
Figure 11C:
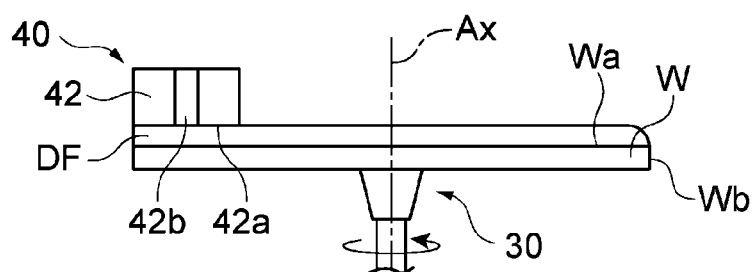

Subsequently, the control device 100 executes step S24. In step S24, for example, the first development controller 104 waits until the nozzle 42 moves to a position where the discharge port 42b faces the outer periphery Wb. The first development controller 104 determines whether or not the nozzle 42 has moved to a position facing the outer periphery Wb, according to, for example, a rotational angle of a motor included in the nozzle driver 52. As a result, as shown in FIG. 11B, the nozzle 42, which is discharging the developer at the first flow rate, moves from the center of the workpiece W, which is rotating while coming into contact with the developer on the front surface Wa of the workpiece W, toward the outer periphery Wb thereof.

Subsequently, the control device 100 executes step S25. In step S25, for example, the first development controller 104 stops the movement of the nozzle 42 by the nozzle driver 52. With the above, the scan-out process is completed. In the above steps S23 to S25 (the scan-out process), in a state in which the first development controller 104 controls the developer supply part 40 so as to discharge the developer from the nozzle 42 at the first flow rate, the first development controller 104 moves the nozzle 42 by the nozzle driver 52 from the center of the workpiece W toward the outer periphery Wb of the workpiece W while maintaining the liquid contact state of the nozzle 42.

Subsequently, the control device 100 executes step S26. In step S26, for example, the first development controller 104 waits until a predetermined period of adjustment time elapses after the movement of the nozzle 42 is stopped in step S25. The first development controller 104 controls the developer supply part 40 so as to discharge the developer from the nozzle 42 at the first flow rate in a state in which the discharge port 42b faces the outer periphery Wb of the workpiece W, until the predetermined period of adjustment time elapses. The predetermined period of adjustment time is set in advance according to how much the development on the outer peripheral portion of the workpiece W is advanced in the first developing process.

Subsequently, the control device 100 executes step S27. In step S27, for example, the first development controller 104 causes the developing unit U3 to start the movement of the nozzle 42 toward the center of the workpiece W. As a result, the above-described scan-in process is started. The first development controller 104 causes the nozzle driver 52 to start the movement of the nozzle 42 from the outer periphery Wb of the workpiece W toward the center thereof while continuing to discharge the developer at the first flow rate from the discharge port 42b of the nozzle 42 in contact with the liquid collection DF of the developer.

Figure 11D:
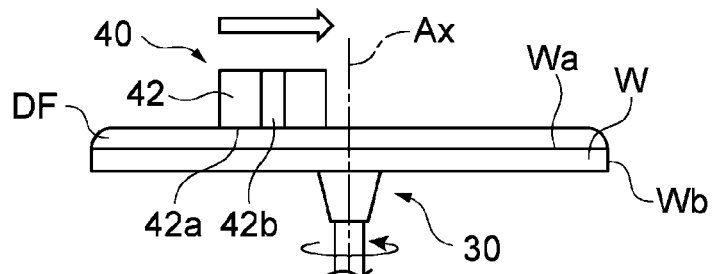

Subsequently, the control device 100 executes step S28. In step S28, for example, the first development controller 104 waits until the nozzle 42 moves to a position (rotational axis Ax) where the discharge port 42b faces the center of the workpiece W. The first development controller 104 determines whether or not the nozzle 42 has moved to a position facing the center of the workpiece W, according to, for example, a rotational angle of a motor included in the nozzle driver 52. As a result, as shown in FIG. 11D, the nozzle 42, which is discharging the developer at the first flow rate, moves from the outer periphery Wb of the workpiece W, which is rotating while coming into contact with the developer on the front surface Wa of the workpiece W, toward the center thereof.

Subsequently, the control device 100 executes step S29. In step S29, for example, the first development controller 104 stops the movement of the nozzle 42 by the nozzle driver 52. This completes the scan-in process. In the above steps S27 to S29 (the scan-in process), in a state in which the first development controller 104 controls the developer supply part 40 so as to discharge the developer from the nozzle 42 at the first flow rate, the first development controller 104 moves the nozzle 42 by the nozzle driver 52 from the outer periphery Wb of the workpiece W toward the center thereof while maintaining the liquid contact state of the nozzle 42. With the above, a series of processes including the first developing process is completed.

(Second Developing Process)

Figure 12:
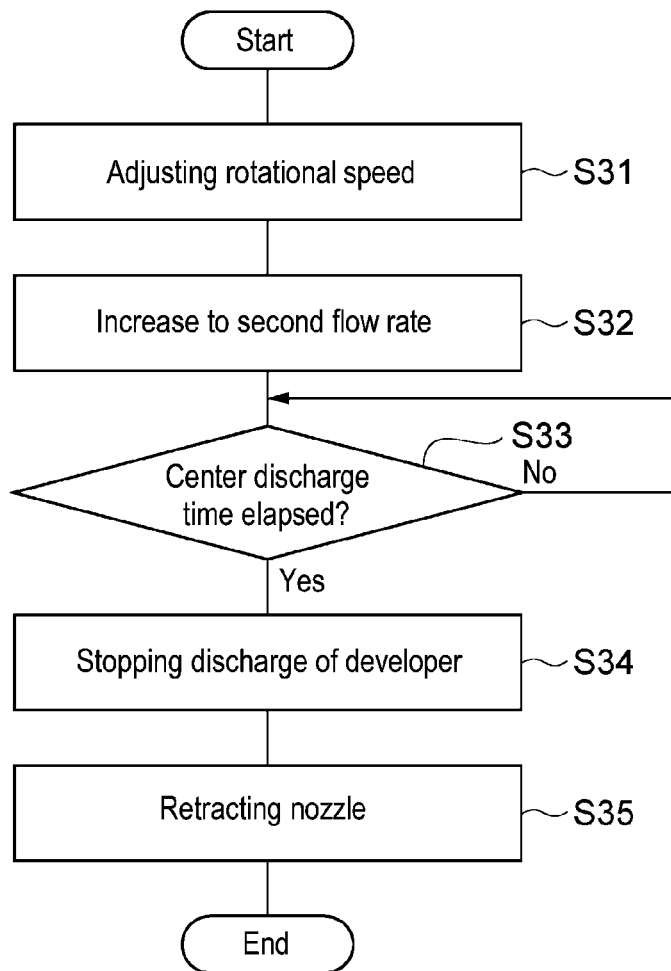
FIG. 12 is a flow chart showing an example of a series of processes including a second developing process.

FIG. 12 is a flow chart showing an example of a series of processes including the second developing process of step S03 and processes before and after the second developing process. The control device 100 executes step S31 after the above-described step S29 is executed. In step S31, for example, the control device 100 controls the rotating/holding part 30 so that the rotational speed of the workpiece W is adjusted to the set value in the first developing process.

Figure 13:
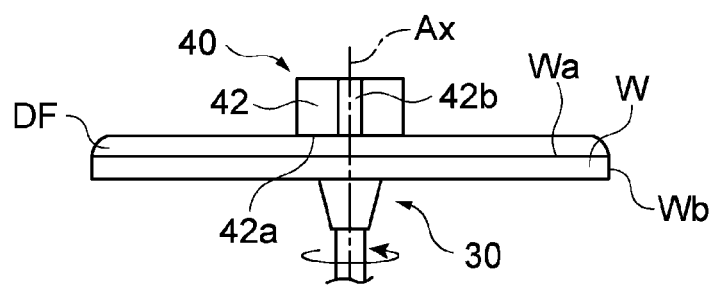
FIG. 13 is a schematic view for explaining an example of the second developing process.

Subsequently, the control device 100 executes step S32. In step S32, for example, as shown in FIG. 13, the second development controller 106 controls the developer supply part 40 so as to increase the discharge flow rate of the developer from the discharge port 42b from the first flow rate to the second flow rate while allowing the nozzle driver 52 to maintain the state in which the discharge port 42b faces the center of the workpiece W by the end of the scan-in process in step S29. In order to increase the discharge flow rate from the first flow rate to the second flow rate, the second development controller 106 may control the valve 48 so as to increase the opening degree of the valve 48 of the developer supply part 40, or may control the pump 46 so as to increase a pressure for forcibly feeding the developer by the pump 46. The second developing process is started as the discharge flow rate of the developer from the discharge port 42b increases to the second flow rate.

Subsequently, the control device 100 executes step S33. In step S33, for example, the second development controller 106 waits from the start of the second developing process in step S32 until a period of center discharge time elapses. The period of center discharge time is set in advance to such an extent that development of a resist film progresses sufficiently in developing processes including this second developing process, the first developing process in step S02, and a third developing process in step S05 which will be described in detail later.

Subsequently, the control device 100 executes step S34. In step S34, for example, the second development controller 106 controls the developer supply part 40 so as to stop the discharge of the developer from the nozzle 42. The second development controller 106 stops the discharge of the developer from the discharge port 42b of the nozzle 42 by switching the valve 48 of the developer supply part 40 from the opened state to the closed state. In the above steps S32 to S34 (the second developing process), the second development controller 106 controls the developer supply part 40 so as to discharge the developer from the nozzle 42 at the second flow rate while maintaining the liquid contact state of the nozzle 42 at a position facing the center of the front surface Wa of the workpiece W.

Subsequently, the control device 100 executes step S35. In step S35, for example, the nozzle switching controller 117 controls the nozzle driver 52 so as to retract the nozzle 42 from the center of the front surface Wa of the workpiece W to the outside of the workpiece W. At this time, the liquid collection DF of the developer is formed on the front surface Wa of the workpiece W. With the above, the series of processes including the second developing process is completed. In addition, the nozzle switching controller 117 may control the nozzle driver 52 so as to perform the plurality of retraction operations described above for raising the nozzle 42 stepwise when the nozzle 42 is retracted in step S35.

(First Rinsing Process)

FIG. 14 is a flow chart showing an example of a series of processes including the first rinsing process of step S04 and processes before and after the first rinsing process. The control device 100 executes steps S41 and S42 after the above-described step S35 is executed. In step S41, for example, the control device 100 controls the rotating/holding part 30 so that the rotational speed of the workpiece W is adjusted to the set value in the first rinsing process. In step S42, for example, the nozzle switching controller 117 controls the nozzle driver 72 so as to dispose the nozzle 62 of the rinsing liquid supply part 60 at a position facing the center (rotational axis Ax) of the front surface Wa of the workpiece W.

Figure 15A:
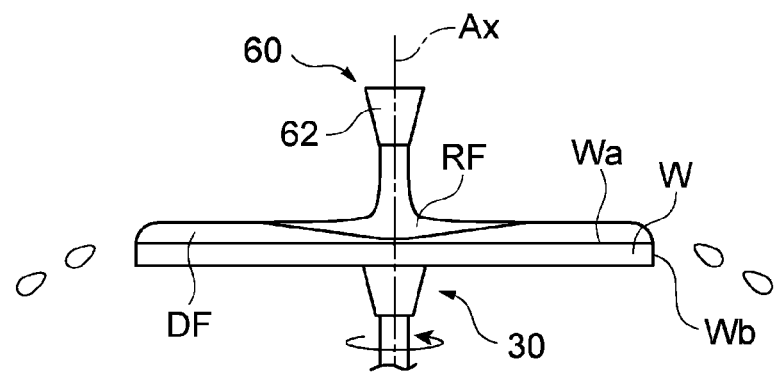
FIGS. 15A to 15C are schematic views for explaining an example of the first rinsing process.
Figure 15B:
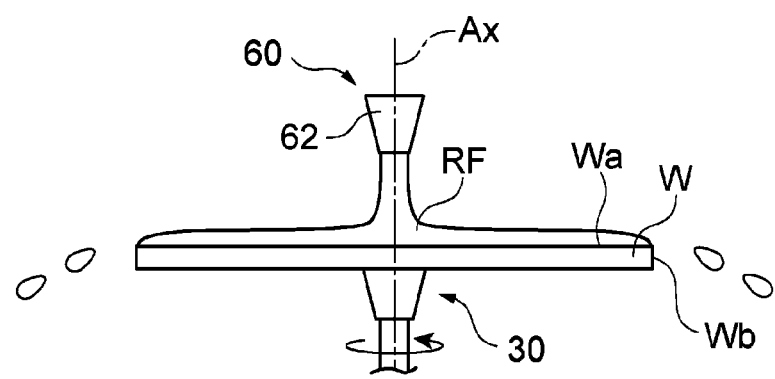

Subsequently, the control device 100 executes steps S43 and S44. In step S43, for example, as shown in FIG. 15A, the first rinse controller 112 controls the rinsing liquid supply part 60 to start the supply of the rinsing liquid from the nozzle 62 disposed on the rotational axis Ax to the front surface Wa of the workpiece W. The first rinse controller 112 may start the discharge of the rinsing liquid from the nozzle 62 by switching the valve 68 of the rinsing liquid supply part 60 from the closed state to the opened state. The first rinse controller 112 may control the pump 66 or the valve 68 so that the discharge flow rate of the rinsing liquid from the nozzle 62 becomes the third flow rate. In step S44, for example, the first rinse controller 112 waits until a period of rinse time elapses from the start of the discharge of the rinsing liquid in step S43. The period of rinse time is set in advance to such an extent that, for example, as shown in FIG. 15B, the liquid collection DF of the developer on the front surface Wa of the workpiece W is replaced with the liquid film RF of the rinsing liquid.

Subsequently, the control device 100 executes step S45. In step S45, for example, the first rinse controller 112 controls the rinsing liquid supply part 60 so as to stop the supply of the rinsing liquid from the nozzle 62 to the front surface Wa of the workpiece W. The first rinse controller 112 may stop the discharge of the rinsing liquid from the nozzle 62 by switching the valve 68 of the rinsing liquid supply part 60 from the opened state to the closed state. In the above steps S42 to S44 (the first rinsing process), the second rinse controller 116 supplies the rinsing liquid to the front surface Wa of the workpiece W by discharging the rinsing liquid at the third flow rate from the nozzle 62 toward the front surface Wa of the workpiece W being rotated.

Figure 15C:
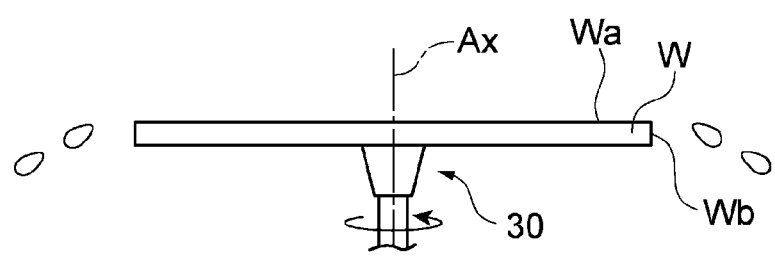

Subsequently, the control device 100 executes steps S46 and S47. In step S46, for example, the nozzle switching controller 117 controls the nozzle driver 72 so as to retract the nozzle 62 from the center of the workpiece W to the outside of the workpiece W. In step S47, for example, the control device 100 waits until a period of shake-off time elapses from the stop of the supply of the rinsing liquid in step S45. The period of shake-off time is set in advance to such an extent that, for example, as shown in FIG. 15C, at least some of the rinsing liquid on the front surface Wa of the workpiece W is shaken off to the outside of the workpiece W. In addition, the control device 100 may control the rotating/holding part 30 so as to increase the rotational speed of the workpiece W after the supply of the rinsing liquid is stopped, over the rotational speed in the first rinsing process. With the above, the series of processes including the first rinsing process is completed.

(Third Developing Process)

FIG. 16 is a flow chart showing an example of a series of processes including the third developing process of step S05 and processes before and after the third developing process. The control device 100 executes steps S51 and S52 after the above-described step S47 is executed. In step S51, for example, the control device 100 controls the rotating/holding part 30 so that the rotational speed of the workpiece W is adjusted to the set value in the third developing process. In step S52, for example, the nozzle switching controller 117 controls the nozzle driver 52 so as to dispose the nozzle 42 at a position where the discharge port 42b of the nozzle 42 of the developer supply part 40 faces the center (rotational axis Ax) of the front surface Wa of the workpiece W.

Subsequently, the control device 100 executes step S53. In step S53, for example, the third development controller 114 causes the developing unit U3 to discharge the developer from the nozzle 42, move the nozzle 42 toward the outer periphery Wb, and reduce the rotational speed of the workpiece W. The third development controller 114 starts the discharge of the developer from the discharge port 42b of the nozzle 42 by the developer supply part 40 and causes the nozzle driver 52 to start the movement of the nozzle 42 from the center of the workpiece W toward the outer periphery Wb thereof. The third development controller 114 may start the discharge of the developer from the nozzle 42 by switching the valve 48 of the developer supply part 40 from the closed state to the opened state. The third development controller 114 may control the developer supply part 40 so that the discharge flow rate of the developer from the nozzle 42 becomes the first flow rate.

Subsequently, the control device 100 executes step S54. In step S54, for example, the third development controller 114 waits until the nozzle 42 moves to a position where the discharge port 42b faces the outer periphery Wb. The third development controller 114 determines whether or not the nozzle 42 has moved to a position facing the outer periphery Wb, depending on, for example, a rotational angle of a motor included in the nozzle driver 52. As a result, the nozzle 42 in contact with the developer formed on the front surface Wa of the workpiece W due to the discharge of the developer in the process moves from the center of the rotating workpiece W toward the outer periphery Wb thereof while continuing to discharge the developer (the scan-out process in the third developing processing is performed). At this time, as the center (the discharge port 42b) of the end surface 42a of the nozzle 42 approaches the outer periphery Wb of the workpiece W, the third development controller 114 may control the rotating/holding part 30 so as to gradually reduce the rotational speed of the workpiece W.

Subsequently, the control device 100 executes step S55. In step S55, for example, the third development controller 114 stops the discharge of the developer from the nozzle 42 and the movement of the nozzle 42 by the developer supply part 40, and causes the rotating/holding part 30 to complete the deceleration of the rotation of the workpiece W. The third development controller 114 stops the discharge of the developer from the nozzle 42 by switching the valve 48 from the opened state to the closed state.

Subsequently, the control device 100 executes steps S56 and S57. In step S56, for example, the nozzle switching controller 117 controls the nozzle driver 52 so as to retract the nozzle 42 stopped at a position facing the outer periphery Wb of the workpiece W to the outside of the workpiece W. In addition, the nozzle switching controller 117 may control the nozzle driver 52 so as to perform the plurality of retraction operations described above for raising the nozzle 42 stepwise when the nozzle 42 is retracted in step S56. In step S57, for example, the third development controller 114 controls the rotating/holding part 30 so as to stop the rotation of the workpiece W.

Figure 17:
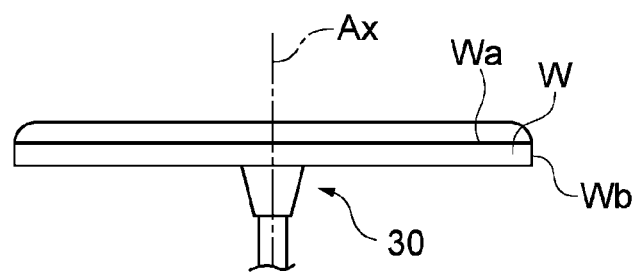
FIG. 17 is a schematic view for explaining an example of the third developing process.

Subsequently, the control device 100 executes step S58. In step S58, for example, the third development controller 114 waits until a period of development time elapses from the stop of the discharge of the developer in step S55. In this case, as shown in FIG. 17, the state in which the liquid collection DF of the developer is formed on the front surface Wa of the workpiece W is maintained by the stop of the rotation of the workpiece W. In addition, the third development controller 114 may cause the developing unit U3 to maintain the state in which the liquid collection DF of the developer is formed, by maintaining the workpiece W at a low rotational speed (for example, the rotational speed at the time of end of the deceleration control in step S56) by the rotating/holding part 30 without stopping the rotation of the workpiece W. The period of development time is set in advance to such an extent that development of a resist film progresses sufficiently. In step S58, when the period of development time elapses, the series of processes including the third developing process is completed.

(Modifications)

The above-described pattern forming process and the procedure of each step included in the respective process are examples and may be changed as appropriate. For example, some of the above-described steps (processes) may be omitted, or the steps may be executed in a different order. In addition, two or more of the above-described steps may be combined, or some of the steps may be modified or deleted. Alternatively, other steps may be performed in addition to each of the above steps.

The second development controller 106 may cause the developing unit U3 to intermittently execute the second developing process with a period during which the discharge flow rate of the developer from the nozzle 42 is smaller than the second flow rate, interposed between a preceding round of the second developing process and a subsequent round of the second developing process. During the period when the discharge flow rate is smaller than the second flow rate, the control device 100 may control the developer supply part 40 so that the developer is discharged from the nozzle 42 at a flow rate smaller than the second flow rate. Alternatively, the control device 100 may control the developer supply part 40 so that the developer is not discharged from the nozzle 42 (so that the discharge is stopped). In this way, the period during which the discharge flow rate is smaller than the second flow rate includes a period during which the developer is discharged at a flow rate smaller than the second flow rate, and a period during which the developer is not discharged. For the period during which the discharge flow rate is smaller than the second flow rate, the control device 100 may maintain the rotation of the workpiece W at the same rotational speed as in the second developing process by the rotating/holding part 30.

When the second developing process is intermittently executed, the second development controller 106 may control the rotating/holding part 30 so that the rotational speed of the workpiece W in the second developing process becomes higher than that of the workpiece W in the period during which the discharge flow rate is smaller than the second flow rate in the second developing process that is intermittently executed. By setting the rotational speed in the second developing process to be larger than the rotational speed in the period when the discharge flow rate is smaller than the second flow rate, removal of dissolution products may be promoted and the degree of progress of development may be adjusted.

A height position of the nozzle 42 when the developer is discharged at the second flow rate in the second developing process may be higher than that of the nozzle 42 in other developing processes such as the first developing process and the third developing process. For example, the control device 100 may control the nozzle driver 52 so as to move the nozzle 42 upward before the start of the second developing process and after the end of the first developing process. In this case, a portion of the end surface 42a that comes into contact with the developer on the front surface Wa of the workpiece W in the second developing process is smaller than a portion that comes into contact with the developer in the first developing process. In this state, even when the discharge flow rate of the developer is lower than that in a state in which substantially the entire end surface 42a is in contact with the developer on the front surface Wa of the workpiece W, the liquid collection vertically below the discharge port 42b becomes smaller. Therefore, it is considered that the flow of the developer is easily changed (smoothly changed), causing a low possibility of decrease of the pressure in the developer and momentary flowing-out of the liquid, which induce bubbles.

The second development controller 106 may change the rotational direction of the workpiece W in the second developing process. Specifically, the second development controller 106 may control the rotating/holding part 30 so as to alternately perform rotating the workpiece W in one rotational direction (forward rotation: for example, clockwise) and rotating the workpiece W in the other rotational direction (backward rotation: for example, counterclockwise) opposite the one rotational direction. In this way, by rotating the workpiece W in both the forward rotation and the backward rotation in the second developing process, the flow of the developer changes at each position of the front surface Wa of the workpiece W between the forward rotation and the backward rotation. Therefore, the dissolution products can be efficiently removed from the front surface Wa of the workpiece W whose pattern generation is started by development. Further, since the flow of the developer on the front surface Wa changes, it is possible to suppress the bias of the local development progress in the plane. The second development controller 106 may control the rotating/holding part 30 so as to repeat the rotation of the workpiece W in the forward rotation and the rotation of the workpiece W in the backward rotation a plurality of times in the second developing process.

The control device 100 may cause the developing unit U3 to execute a shake-off process of shaking the developer out of the workpiece W instead of or in addition to the first rinsing process (before the first rinsing process) in step S04. In this case, as shown in FIG. 5, the control device 100 may further include a shake-off controller 118 that causes the developing unit U3 to execute the shake-off process, as a functional module. The shake-off process is a process of rotating the workpiece W by the rotating/holding part 30 so that the developer on the front surface Wa of the workpiece W is shaken out of the workpiece W in a state in which the discharge of the developer from the nozzle 42 is stopped by the developer supply part 40. A rotational speed and a rotation time in the shake-off process are set to such an extent that the developer can be shaken out of the workpiece W (the developer on the front surface Wa can be discharged). In one example, they are set to such the same extent as the rotational speed and the developer discharge time in the second developing process in step S03.

Figure 18:
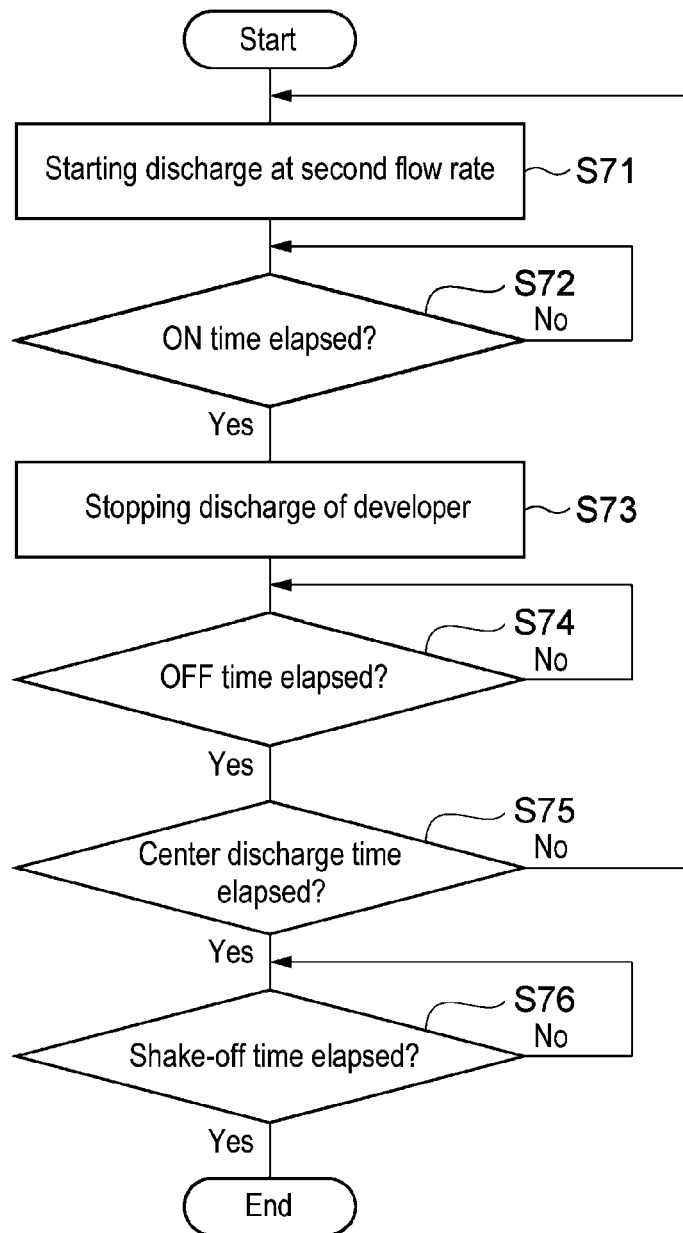
FIG. 18 is a flow chart showing an example of a series of processes including the second developing process.

FIG. 18 shows a flow chart in a case where the second developing process is intermittently executed and the shake-off process is executed following the second developing process. First, the control device 100 executes step S71. In step S71, for example, the second development controller 106 causes the developer supply part 40 to start the discharge of the developer from the nozzle 42 at the second flow rate. This starts the second developing process. Subsequently, the control device 100 executes step S72. In step S72, for example, the second development controller 106 waits until a predetermined period of ON time elapses from the start of the second developing process in step S71. As a result, the second developing process (the state in which the developer is discharged at the second flow rate) continues until the predetermined period of ON time elapses.

Subsequently, the control device 100 executes steps S73 and S74. In step S73, for example, the second development controller 106 stops the discharge of the developer from the nozzle 42 by the developer supply part 40. As a result, the second developing process is temporarily interrupted. In step S74, for example, the control device 100 waits until a predetermined period of OFF time elapses from the stop of the discharge of the developer in step S73. As a result, a state in which the second developing process is not performed (the state in which the discharge of the developer is stopped) continues until the predetermined period of OFF time elapses.

Subsequently, the control device 100 executes step S75. In step S75, for example, the control device 100 determines whether or not the total execution period of the second developing process exceeds a predetermined period of center discharge time. When it is determined in step S75 that the total execution period of the second developing process does not exceed the predetermined period of center discharge time, the control device 100 repeats steps S71 to S75. The predetermined period of center discharge time used in step S75 is set so that a plurality of second developing processes are intermittently executed. The predetermined period of ON time and the predetermined period of OFF time are set in consideration of, for example, a balance between the progress of the developer and the saving of the developer.

When it is determined in step S75 that the total execution period of the plurality of second developing processes exceeds the predetermined period of center discharge time, the control device 100 executes step S76. In step S76, for example, the shake-off controller 118 waits until the predetermined period of shake-off time elapses from the time when it is determined in step S75 that the predetermined period of center discharge time is exceeded. As a result, during the predetermined period of shake-off time, the workpiece W is rotated by the rotating/holding part 30 so that the developer on the front surface Wa of the workpiece W is shaken out of the workpiece W in a state in which the developer is not discharged from the nozzle 42. In addition, the shake-off controller 118 may control the rotating/holding part 30 so that the rotational speed of the workpiece W in the shake-off process has a set value before executing step S76. With the above, the series of processes including the second developing process and the shake-off process, which are intermittently executed, are completed.

In the first developing process, the control device 100 may cause the developing unit U3 to execute the scan-in process without causing the developing unit U3 to execute the scan-out process. The control device 100 may cause the developing unit U3 to execute the scan-out process after causing the developing unit U3 to execute the scan-in process. The control device 100 may cause the developing unit U3 to execute a plurality of scan-in processes and a plurality of scan-out processes. The number of executions of the scan-in process and the number of executions of the scan-out process may be different from each other.

The control device 100 may omit the first rinsing process (or the shake-off process). The control device 100 may omit the first rinsing process depending on, for example, the viscosity of processing liquid for formation of the resist film (thickness of the resist film). The control device 100 may determine whether or not to execute the second developing process and the first rinsing process depending on the type (viscosity) of the processing liquid for formation of the resist film or the type information indicating the thickness of the resist film. For example, the control device 100 may determine whether or not to execute the second developing process and the first rinsing process in three stages depending on the type information. In one example, when the viscosity or film thickness indicated by the type information is smaller than a first threshold value, the control device 100 may not cause the developing unit U3 to execute the second developing process and the first rinsing process. When the viscosity or film thickness indicated by the type information is larger than the first threshold value and smaller than a second threshold value, the control device 100 may cause the developing unit U3 to execute the second developing process and may not cause the developing unit U3 to execute the first rinsing process. The second threshold value is set to be larger than the first threshold value. When the viscosity or film thickness indicated by the type information is larger than the second threshold value, the control device 100 may cause the developing unit U3 to execute the second developing process and the first rinsing process. Depending on the type information, whether or not to execute the second developing process and the first rinsing process may be set in advance by an operator instead of the control device 100.

Effects of Embodiments

The substrate processing method described above includes performing the first developing process of moving the nozzle 42 while making the end surface 42a come into contact with the developer on the front surface Wa of the workpiece W in a state in which the nozzle 42 having the end surface 42a and the discharge port 42b opened at the end surface 42a is disposed so that the end surface 42a faces the front surface Wa of the workpiece W and the developer is discharged from the discharge port 42b at the first flow rate while rotating the workpiece W, and after the first developing process, performing the second developing process of discharging the developer from the discharge port 42b at the second flow rate higher than the first flow rate in a state in which the end surface 42a is in contact with the developer on the front surface Wa of the workpiece W at a position facing the center of the front surface Wa of the workpiece W while rotating the workpiece W.

In a film thickness distribution of a film to be subjected to a developing process using a developer, the film thickness at the central portion of the workpiece W tends to be larger than that at the outer peripheral portion of the workpiece W. Therefore, in the central portion of the workpiece W, the degree of development in the film thickness direction may be insufficient as compared with the outer peripheral portion of the workpiece W. Further, even if the degree of development is made uniform between the central portion and the outer peripheral portion, the degree of development may be insufficient in the central portion having a large film thickness. On the other hand, in the substrate processing method and the coating/developing apparatus 2, the developer is discharged near the center of the front surface Wa of the workpiece W after the first developing process. As a result, in the second developing process, since the development in the central portion progresses more than in the outer peripheral portion, a difference in the degree of progress of development between the central portion of the workpiece W and the outer peripheral portion thereof becomes smaller, thereby resolving the lack of development in the central portion. Therefore, it is effective in making the developing process in the plane of the workpiece W uniform. Further, by discharging the developer at the second flow rate higher than the first flow rate in the first developing process, the development progresses quickly so that the dissolution products generated with the development can be quickly discharged to the outside of the workpiece W.

The first developing process may include moving the nozzle 42 from the outer periphery Wb of the workpiece W toward the center of the workpiece W while making the end surface 42a come into contact with the developer on the front surface Wa of the workpiece W in a state in which the developer is discharged from the discharge port 42b at the first flow rate while rotating the workpiece W. In the substrate processing method, the second developing process may be started with the increase in the discharge flow rate of the developer from the discharge port 42b from the first flow rate to the second flow rate in a state in which the nozzle 42 is disposed at a position facing the center of the front surface Wa of the workpiece W by the first developing process. In this case, a period from the first developing process to the second developing process can be shortened, which is effective in improving the efficiency of the developing process.

The first developing process may further include moving the nozzle 42 from the center of the workpiece W toward the outer periphery Wb of the workpiece W while making the end surface 42a come into contact with the developer on the front surface Wa of the workpiece W in a state in which the developer is discharged from the discharge port 42b at the first flow rate while rotating the workpiece W, before moving the nozzle 42, which discharges the developer at the first flow rate, from the outer periphery Wb of the workpiece W toward the center of the workpiece W. In this case, in the first developing process, the developer is coated on the front surface Wa of the workpiece W at least twice. Since a contact angle of the developer with respect to the front surface Wa of the workpiece W is lowered by the first round of coating, the developer can be easily spread by the second round of coating.

In the substrate processing method, the second developing process may be intermittently executed with a period during which the discharge flow rate of the developer from the discharge port 42b is smaller than the second flow rate, interposed between a preceding round of the second developing process and a subsequent round of the second developing process. In this case, the dissolution products can be discharged to the outside of the workpiece W during the second developing process while reducing the amount of the developer used.

The rotational speed of the workpiece W in the second developing process may be larger than the rotational speed of the workpiece W in a period during which the discharge flow rate of the developer is smaller than the second flow rate during the second developing process executed intermittently. In this case, the degree of progress of development can be adjusted while promoting removal of the dissolution products.

The rotating the workpiece W in the second developing process may include rotating the workpiece W in one direction and rotating the workpiece W in the other direction opposite the one direction. In this case, since the flow of the developer changes at each position on the front surface Wa of the workpiece W, the dissolution products can be efficiently removed from the front surface Wa of the workpiece W where pattern generation is started by development. Further, since the flow of the developer on the front surface Wa changes, it is possible to suppress the bias of the local development progress in the plane.

The substrate processing method may further include, after the second developing process, rotating the workpiece W so that the developer W on the front surface Wa of the workpiece W is shaken out of the workpiece W in a state in which the discharge of the developer from the discharge port 42b is stopped. In this case, it is possible to more reliably remove the dissolution products generated on the front surface Wa of the workpiece W with the second developing process.

The substrate processing method may further include, after the second developing process, supplying the rinsing liquid to the front surface Wa of the workpiece W while rotating the workpiece W, and after supplying the rinsing liquid, performing the third developing process of holding the liquid collection of the developer on the front surface Wa of the workpiece W by supplying the developer to the front surface Wa of the workpiece W from the nozzle 42 so as to form the liquid collection of the developer. In this case, before the third developing process, the rinsing liquid can more reliably remove the dissolution products generated on the front surface Wa of the workpiece W with the second developing process.

The supplying the rinsing liquid may include discharging the rinsing liquid from the nozzle 62 toward the front surface Wa of the workpiece W at the third flow rate equal to or higher than the second flow rate. In this case, it is possible to quickly remove the dissolution products generated on the front surface Wa of the workpiece W with the second developing process.

The rotational speed of the workpiece W when supplying the rinsing liquid may be equal to or higher than that of the workpiece W in the second developing process. In this case, it is possible to quickly remove the dissolution products generated on the front surface Wa of the workpiece W with the second developing process.

The substrate processing method may further include, after the second developing process, performing a plurality of retraction operations of retracting the nozzle 42 in a state in which the discharge of the developer is stopped. Each of the plurality of retraction operations may include raising the nozzle 42 and stopping the nozzle 42 after raising the nozzle 42. In this case, the developer adhering to the end surface 42a of the nozzle 42 can be removed by performing the plurality of retraction operations, causing a low possibility of falling the developer from the end surface 42a when the nozzle 42 is retracted to the outside of the workpiece W.

When the processing liquid for forming a resist film is a resist liquid having a medium viscosity or higher, the central portion in the film thickness distribution tends to bulge more than the outer peripheral portion. Further, when the resist liquid having the medium viscosity or higher is used, the thickness of the resist film becomes large (for example, 5 μm or more). In the second developing process, since the developer is discharged while rotating the workpiece W, the development can be progressed not only in the central portion of the workpiece W but also in the outer peripheral portion thereof. Therefore, even if the film thickness is set to be such an extent that cannot be sufficiently developed by the third developing process alone, the development of the entire film can be progressed by performing the second developing process as well. Therefore, the substrate processing method and the coating/developing apparatus 2 are more useful when a resist liquid having a medium viscosity or higher is used.

According to the present disclosure in some embodiments, it is possible to provide a substrate processing method, a non-transitory computer-readable storage medium, and a substrate processing apparatus which are effective in making a developing process in the plane of a substrate uniform.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, the method comprising:
performing a pre-wetting process of supplying a rinsing liquid to a front surface of the substrate by a rinsing liquid supply part;
retracting the rinsing liquid supply part to outside of the substrate;
in a state in which the rinsing liquid supply part is retracted to the outside of the substrate, performing a first developing process of discharging a developer from a discharge port opened at an end surface of a nozzle which is moving in a first direction from a center of the substrate toward an outer periphery of the substrate, and subsequently, in a second direction from the outer periphery toward the center in a state in which the end surface is in contact with the developer on the front surface of the substrate at a position facing the front surface of the substrate while rotating the substrate; and
after the first developing process, performing a second developing process of moving the nozzle in the first direction from the center toward the outer periphery in the state while rotating the substrate.

2. The method of claim 1, wherein the second developing process includes gradually reducing a rotational speed of the substrate by a rotating/holding part as the discharge port of the nozzle approaches the outer periphery.

3. The method of claim 1, wherein the first developing process includes keeping the end surface in contact with the developer on the front surface of the substrate during a period between the movement of the nozzle in the first direction from the center of the substrate toward the outer periphery and the movement of the nozzle in the second direction from the outer periphery toward the center.

4. A non-transitory computer-readable storage medium storing a program that causes an apparatus to execute the method of claim 1.

5. A substrate processing apparatus comprising:
a rotating/holding part configured to hold and rotate a substrate;
a rinsing liquid supply part configured to supply a rinsing liquid to a front surface of the substrate;
a liquid supply part including: a nozzle including an end surface facing the front surface of the substrate held by the rotating/holding part, and a discharge port opened at the end surface and configured to discharge a developer through the discharge port; and
a driving part configured to move the nozzle along the front surface of the substrate; and
a controller configured to control the rotating/holding part, the rinsing liquid supply part and the liquid supply part,
wherein the controller sequentially executes:
a pre-wetting process of supplying the rinsing liquid to the front surface of the substrate by the rinsing liquid supply part;
a retraction process of retracting the rinsing liquid supply part to outside the substrate;
in a state in which the rinsing liquid supply part is retracted to the outside of the substrate, a first developing process of discharging the developer from the discharge port opened at the end surface of the nozzle which is moving in a first direction from a center of the substrate toward an outer periphery of the substrate, and subsequently, in a second direction from the outer periphery toward the center in a state in which the end surface is in contact with the developer on the front surface of the substrate at a position facing the front surface of the substrate while rotating the substrate; and
after the first developing process, performing a second developing process of moving the nozzle in the first direction from the center toward the outer periphery in the state while rotating the substrate.

6. The method of claim 1, wherein after the second developing process, performing a retraction process of retracting the nozzle including raising the nozzle stepwise.

7. The substrate processing apparatus of claim 5, wherein the controller further executes: after the second developing process, performing a retraction process of retracting the nozzle including raising the nozzle stepwise.

* * * * *